(12) United States Patent
Shin et al.

(10) Patent No.: US 9,373,998 B2
(45) Date of Patent: Jun. 21, 2016

(54) POWER CONVERSION DEVICE

(75) Inventors: Kentaro Shin, Yokohama (JP); Kraisorn Throngnumchai, Yokohama (JP)

(73) Assignee: NISSAN MOTOR CO., LTD., Yokohama-Shi, Kanagawa (JP)

( * ) Notice: Subject to any disclaimer, the term of this patent is extended or adjusted under 35 U.S.C. 154(b) by 130 days.

(21) Appl. No.: 14/347,514

(22) PCT Filed: Sep. 10, 2012

(86) PCT No.: PCT/JP2012/073064
§ 371 (c)(1),
(2), (4) Date: Mar. 26, 2014

(87) PCT Pub. No.: WO2013/047172
PCT Pub. Date: Apr. 4, 2013

(65) Prior Publication Data
US 2014/0218979 A1 Aug. 7, 2014

(30) Foreign Application Priority Data
Sep. 28, 2011 (JP) .................................. 2011-213283

(51) Int. Cl.
*H03K 5/1254* (2006.01)
*H02M 1/44* (2007.01)
*H02M 7/00* (2006.01)
*H05K 9/00* (2006.01)

(52) U.S. Cl.
CPC ................ *H02M 1/44* (2013.01); *H02M 7/003* (2013.01); *H05K 9/0049* (2013.01)

(58) Field of Classification Search
CPC .. H02M 1/12; H02M 2001/123; Y02E 40/40; H03K 5/1252; H03K 5/1254
USPC ............................. 363/39, 40, 144, 146, 147
See application file for complete search history.

(56) References Cited

U.S. PATENT DOCUMENTS

| | | | |
|---|---|---|---|
| 5,683,434 A | 11/1997 | Archer | |
| 6,181,590 B1 * | 1/2001 | Yamane | ................ H01L 25/162 257/E25.03 |
| 7,408,423 B2 | 8/2008 | Asano | |
| 7,619,490 B2 | 11/2009 | Asano | |
| 2002/0075702 A1 | 6/2002 | Igarashi et al. | |
| 2006/0139131 A1 | 6/2006 | Asano | |
| 2006/0258217 A1 | 11/2006 | Hirai | |
| 2008/0268555 A1 | 10/2008 | Asano | |

FOREIGN PATENT DOCUMENTS

| | | |
|---|---|---|
| EP | 1921739 A2 | 5/2008 |
| JP | 08-047244 A | 2/1996 |
| JP | 2002-252985 A | 9/2002 |
| JP | 2006-080215 A | 3/2006 |

(Continued)

*Primary Examiner* — Gary L Laxton
(74) *Attorney, Agent, or Firm* — Young Basile Hanlon & MacFarlane P.C.

(57) ABSTRACT

A power conversion device has a power module that switches the ON/OFF state of a switching element and converts and outputs input power, a metal housing that houses the power module, and a conductive member connected to the housing. The conductive member is connected to the housing at a position having a length of $n\lambda/4$ from the open end. More specifically, "n" is an odd number of 1 or greater, "$\lambda$" is the wavelength of noise generated by switching the switching element ON or OFF.

11 Claims, 22 Drawing Sheets

(56) References Cited

FOREIGN PATENT DOCUMENTS

| | | | |
|---|---|---|---|
| JP | 2006-185936 A | 7/2006 |
| JP | 2006-344933 A | 12/2006 |
| JP | 2010-182743 A | 8/2010 |
| JP | 2011-171160 A | 9/2011 |

* cited by examiner

221

221

21
221

STRONG

WEAK

POWER CONVERSION DEVICE

CROSS REFERENCE TO RELATED APPLICATION

The present application claims priority to Japanese Patent Application No. 2011-213283, filed Sep. 28, 2011, incorporated herein in its entirety.

TECHNICAL FIELD

The present invention relates to a power conversion device.

BACKGROUND

There has been known a noise reduction device for reducing a noise current passing through a power conversion device by turning on or off a semiconductor switching element which forms an inverter. (Refer to Japanese Patent Application Publication No. 2002-252985.) The power conversion device includes a converter connected to an AC (alternating current) power supply, an inverter connected to the DC (direct current) output side of the converter, and a DC smoothing capacitor connected to a DC intermediate circuit. The noise reduction device includes noise current detecting means for detecting a noise current, and noise compensated current supply means for generating a noise compensated current for reduction of the detected noise current, and supplying the noise compensated current to the power conversion device. The noise compensated current supply means includes a series circuit of a transistor and a Zener diode, in which the transistor is configured as an element to output a current under control of a detection signal from the noise current detecting means and has a withstand voltage lower than a voltage of the DC intermediate circuit.

SUMMARY

However, a problem arises as given below; the transistor and the Zener diode cannot operate at high speed for high-frequency switching noise and thus cannot suppress the noise.

An object of the present invention is to provide a power conversion device capable of suppressing noise caused by switching of an inverter.

A power conversion device according to a first aspect of the present invention includes a power module which switches a switching element between ON and OFF states thereby to convert power inputted to the power module and to output the converted power, a housing made of metal, which houses the power module, and a conductive member connected to the housing. The conductive member has a first open end and is connected to the housing at a position at which a length thereof from the first open end is $n\lambda/4$, where "n" is an odd number equal to or more than 1, and "$\lambda$" is a wavelength of noise produced by switching the switching element between the ON and OFF states.

BRIEF DESCRIPTION OF DRAWINGS

The description herein makes reference to the accompanying drawings wherein like reference numerals refer to like parts throughout the several views.

DESCRIPTION OF EMBODIMENTS

Figure 1:
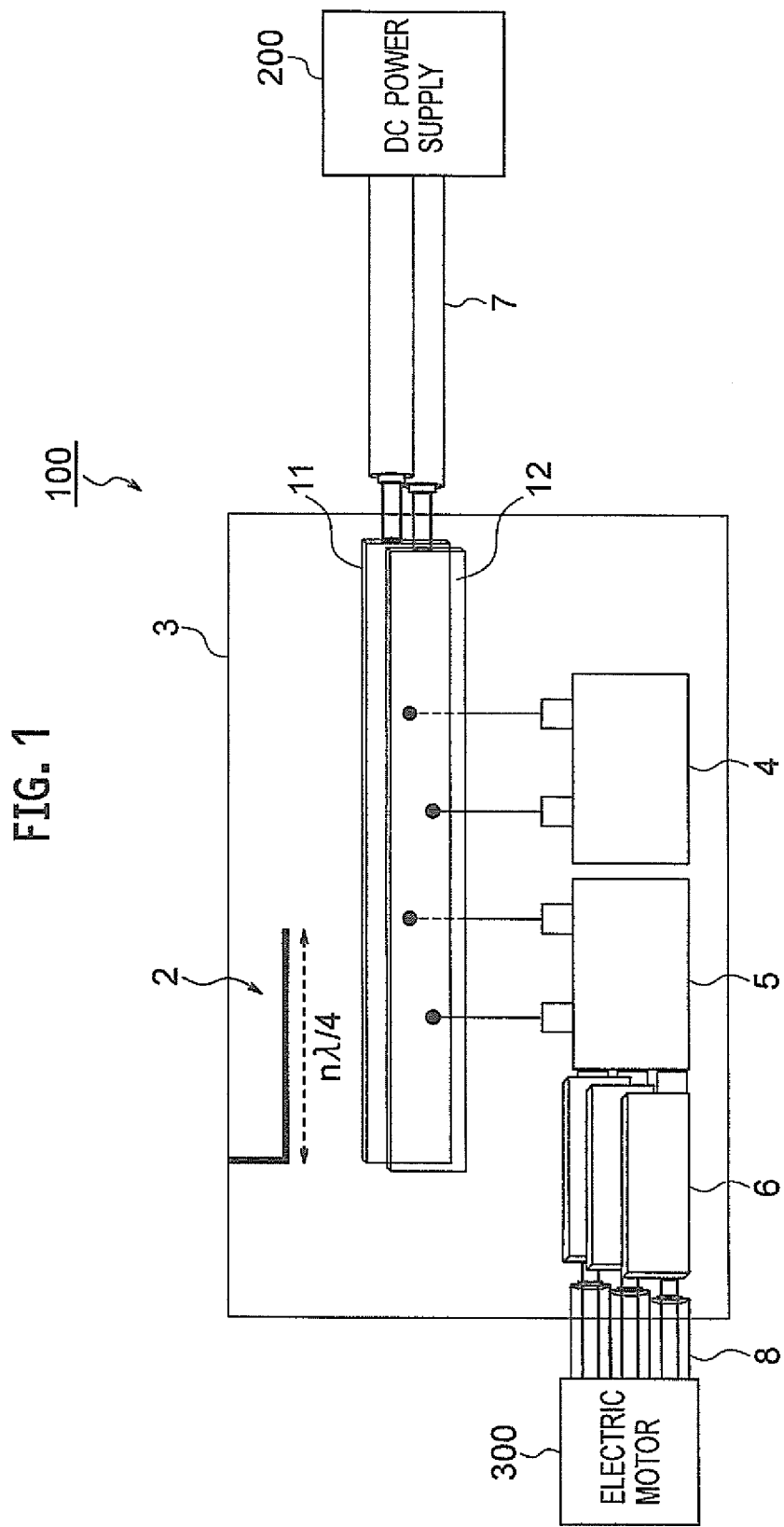
FIG. 1 is a schematic diagram illustrating a drive system for an electric vehicle including a power conversion device according to an embodiment of the present invention.

Embodiments of the present invention will be described below with reference to the drawings.

[First Embodiment]

A drive system for an electric vehicle including a power conversion device according to a first embodiment of the present invention will be described with reference to FIG. 1. The electric vehicle of the first embodiment, the detailed illustration of which will be omitted, is a vehicle which travels using an electric motor 300 such as a three-phase AC power motor as a travel driving source. The electric motor 300 is coupled to an axle of the electric vehicle. Although the electric vehicle will hereinafter be described by way of example, the present invention may also be applied to a hybrid electric vehicle (HEV) or is also applicable to a power conversion device mounted on any device other than a vehicle.

The drive system including the power conversion device of the first embodiment includes a power conversion device 100, a DC power supply 200, the electric motor 300, and shielded wires 7, 8. The DC power supply 200 is formed of plural cells and is connected to the power conversion device 100 by the shielded wire 7. The DC power supply 200 acts as a power source for the vehicle and supplies DC power to the power conversion device 100. The power conversion device 100 is connected between the DC power supply 200 and the electric motor 300, and converts the DC power supplied by the DC power supply 200 into AC power and supplies the AC power to the electric motor 300. The shielded wires 7, 8 are electric wires formed by coating metal wires with resin. The shielded wire 7 is formed of a pair of shielded wires, and one of the shielded wires 7 connects a positive electrode terminal of the DC power supply 200 to a power feeder bus 11, and the other shielded wire 7 connects a negative electrode terminal of the DC power supply 200 to a power feeder bus 12. The shielded wire 8 is formed of three shielded wires, and the three shielded wires 8 connect a bus bar 6 to the electric motor 300, corresponding to U, V and W phases, respectively, of the electric motor 300.

The power conversion device 100 includes the power feeder buses 11, 12, a conductive member 2, a housing 3, a smoothing capacitor 4, a power module 5, and the bus bar 6. The power feeder bus 11 is a power supply line made of an electrical conductor in the form of plate (for example, in the form of flat plate) and configured to feed output power from the positive electrode side of the DC power supply 200 to the power module 5, and corresponds to a positive-side power supply line of an inverter circuit which forms the power conversion device 100. The power feeder bus 12 is a power supply line made of an electrical conductor in the form of plate (for example, in the form of flat plate) and configured to feed output power from the negative electrode side of the DC power supply 200 to the power module 5, and corresponds to a negative-side power supply line of the inverter circuit which forms the power conversion device 100. The power feeder bus 11 and the power feeder bus 12 are oriented facing each other. Portions of the power feeder buses 11, 12 or distal end portions of the power feeder buses 11, 12 are connected as terminals (or tabs) of the power conversion device 100 to distal ends of the shielded wires 7.

The power feeder buses 11, 12 branch off and are connected to a positive electrode terminal and a negative electrode terminal, respectively, of the smoothing capacitor 4 and connected to a positive electrode terminal and a negative electrode terminal, respectively, of the power module 5. The smoothing capacitor 4 is connected between the power feeder bus 11 and the power feeder bus 12 and thereby connected between the DC power supply 200 and the power module 5. The smoothing capacitor 4 is a capacitor for rectifying input and output power to and from the DC power supply 200.

The power module 5 is connected between the DC power supply 200 and the bus bar 6 via the power feeder buses 11, 12. The power module 5 has a modular construction of plural semiconductor switching elements (hereinafter called "switching elements"), such as insulated gate bipolar transistors (IGBTs) or MOS (metal oxide semiconductor) field effect transistors (MOSFETs), on a substrate. Then, the power module 5 is an inverter which switches the switching elements between ON and OFF states based on a control signal from a controller (unillustrated) thereby to convert electric power from the DC power supply 200 and to output the electric power to the electric motor 300 via the bus bar 6. The controller (unillustrated) generates a switching signal for the switching elements from a torque command value corresponding to accelerator opening of the vehicle, and outputs the switching signal to the power module 5. Thus, the power module 5 can switch the switching elements between the ON and OFF states thereby to output AC power in order for the electric motor 300 to achieve desired output torque. The power module 5 is electrically connected to the three-phase electric motor 300 through output lines corresponding to the U, V and W phases, respectively, of the electric motor 300.

The bus bar 6 is formed of three conductive plates each in the shape of a plate made of a conductive material, and connects the power module 5 to the shielded wire 8. A distal end portion of the bus bar 6 is connected as a terminal (or a tab) of the power conversion device 100 to a distal end of the shielded wire 8.

The conductive member 2 is a member for suppressing noise produced by switching operation of the switching elements included in the power module 5, and is made of a material having electrical conductivity and is provided in the housing 3. Incidentally, a specific configuration of the conductive member 2 will be described later. The "switching operation of the switching elements" refers to operation for switching the switching elements between the ON and OFF states.

The housing 3 is a case for internally housing part of the power feeder buses 11, 12, the smoothing capacitor 4, the power module 5, and part of the bus bar 6, and is made of metal. Also, the housing 3 houses a control circuit board (unillustrated) for controlling circuits included in the power conversion device 100. The housing 3 is a housing portion for protecting the power module 5 from the outside.

Description will now be given with regard to noise produced by the power conversion device 100. When the switching elements included in the power module 5 perform the switching operation, switching noise is generated. The switching noise may appear as noises of varying frequencies according to the timing of switching of the switching elements and leak out of the power conversion device 100 through the power feeder buses 11, 12 and the housing 3. In the first embodiment, the power feeder buses 11, 12 are each formed in the shape of a metal plate, and thus, the power feeder buses 11, 12 may act as noise radiation sources.

Figure 2:
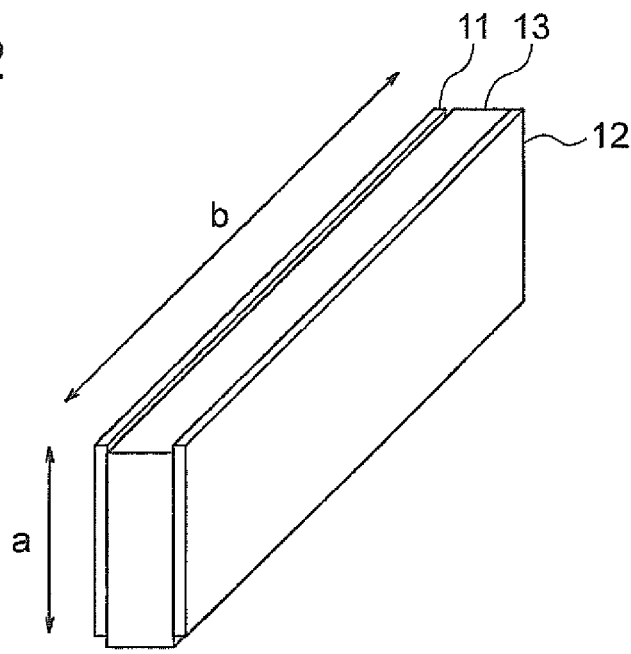
FIG. 2 is a perspective view illustrating power feeder buses 11, 12 of FIG. 1.

Next, the power feeder buses 11, 12 acting as the noise radiation sources will be described with reference to FIG. 2. FIG. 2 illustrates a perspective view of the power feeder buses 11, 12. A resin portion 13 is provided between the power feeder bus 11 and the power feeder bus 12 which are each in the form of plate. The resin portion 13 is provided in order to fix the power feeder buses 11, 12 inside the housing 3. A frequency $f_{mn}$ of an electromagnetic wave which is prone to oscillate on the power feeder buses 11, 12 is determined according to the shape of the power feeder buses 11, 12 and a dielectric constant ($\epsilon_r$) between the power feeder bus 11 and the power feeder bus 12 and is expressed by Equation (1):

$$f_{mn} = \frac{c}{2\pi\sqrt{\epsilon_r}} \sqrt{\left(\frac{h\pi}{a}\right)^2 + \left(\frac{k\pi}{b}\right)^2} \quad (1)$$

where a is the height of the power feeder buses 11, 12; b, the length of the power feeder buses 11, 12; and h, k, degrees.

As illustrated in FIG. 1, the power feeder buses 11, 12 are connected via wiring to the power module 5. Thus, in a case where switching noise is produced by the power module 5, the switching noise propagates through the power feeder buses 11, 12. Therefore, the power feeder buses 11, 12 act as generation sources of noise having mainly the frequency represented by Equation (1). For example, the oscillation-prone frequency is 200 MHz when (h, k)=(2, 0), assuming that a=0.3 (m), b=0.03 (m), and $\epsilon_r$=6.25.

Figure 3:
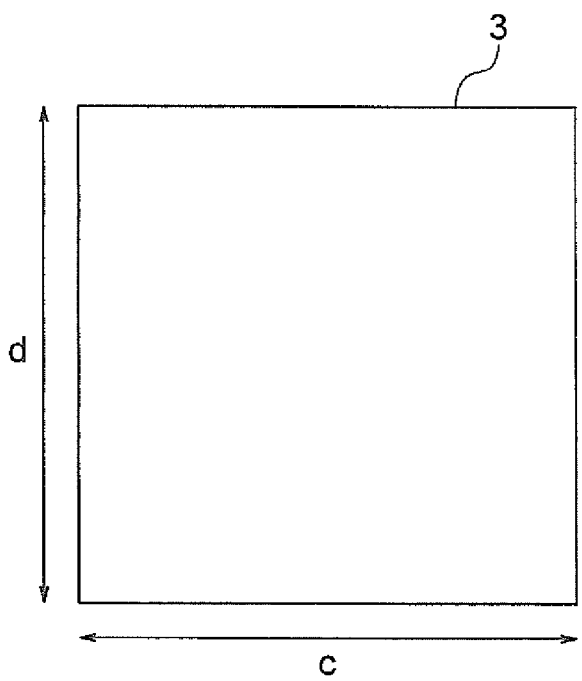
FIG. 3 is a plan view illustrating one surface of a housing 3 of FIG. 1.
Figure 4:
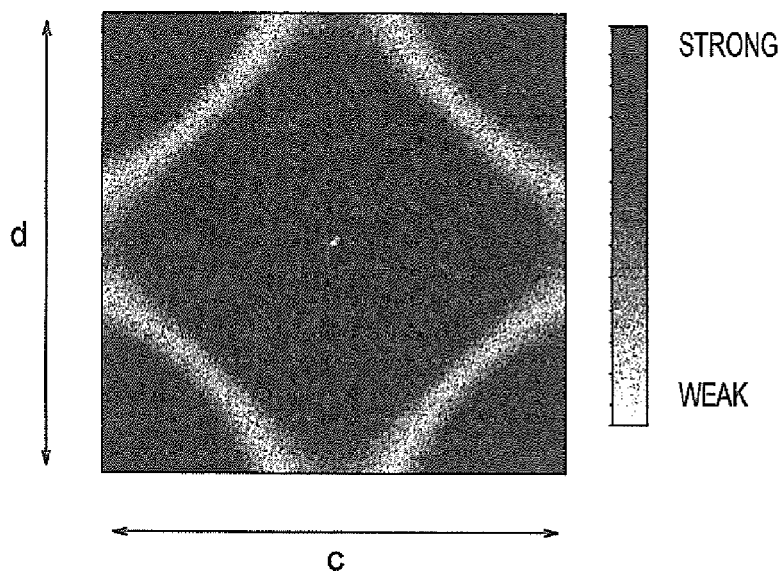
FIG. 4 is a graph representing a noise distribution on the one surface of the housing 3 of FIG. 3.

Next, noise oscillation in the housing 3 will be described with reference to FIG. 3. FIG. 3 is a plan view illustrating one surface of the housing 3. The one surface of the housing 3 is illustrated as simplified for convenience of explanation. Also, c, d are length and width dimensions, respectively, of the one surface of the housing 3. A frequency of an electromagnetic wave which is prone to oscillate on the one surface of the housing 3 is represented in the same manner as Equation (1). For example, the oscillation-prone frequency is 200 MHz, which coincides with the frequency which is prone to oscillate in the power feeder buses 11, 12, when (h, k)=(2, 2), assuming that a, b=1.5 (m) and $\epsilon_r$=1. Also, in this case, a noise distribution on the one surface of the housing 3 is illustrated in FIG. 4. FIG. 4 is a graph representing simulated results of the noise distribution on the one surface of the housing 3.

Specifically, when the shape of the power feeder buses 11, 12, the shape of the housing 3 and the dielectric constant are under certain conditions, switching noise (or high-frequency noise) produced by the switching operation of the switching elements is radiated from the power feeder buses 11, 12 and is excited on the one surface of the housing 3. As a result, the switching noise may leak out of the housing 3 as radiation noise.

Therefore, in the embodiment, as described below, the conductive member 2 is provided on the housing 3 thereby to suppress leakage of noise from the housing 3 based on the switching noise.

Returning to FIG. 1, the conductive member 2 is formed in linear shape, and one end of the conductive member 2 is connected to the housing 3, and the other end of the conductive member 2 is configured as an open end. The conductive member 2 is formed for example by applying metallic tape or the like to the housing 3. A length of the conductive member 2 is set according to a noise wavelength which propagates along the housing 3 in a planar manner. The noise wavelength ($\lambda$) is represented by Equation (2):

$$\lambda = \frac{c}{f} \quad (2)$$

where c is a propagation rate; and f, a noise frequency. Incidentally, the noise frequency (f) is determined based on the frequency of the switching noise or the shape of the power feeder buses 11, 12. For example, the noise wavelength is 1.5 (m), which is calculated from Equation (2), assuming that the noise frequency (f) radiated from the power feeder buses 11, 12 by the switching noise is 200 MHz and the propagation rate (c) is $3 \times 10^8$ (m/s).

Then, when noise having the noise wavelength ($\lambda$) propagates along the one surface of the housing 3 and to a point of connection to the conductive member 2, the noise propagates from the point of connection to the conductive member 2 along the open end and is reflected at the open end. Then, the reflected noise is reflected also at an end portion on the opposite side, or equivalently, at a point of connection between the conductive member 2 and the housing 3. Thus, in the conductive member 2, the noise entering toward the end portion and the noise reflected from the end portion interfere with each other. Thus, noises with the wavelength ($\lambda$) can be canceled out by defining the length of the conductive member 2, as represented by Equation (3):

$$L = \frac{n\lambda}{4} \quad (3)$$

where n is an odd number equal to or more than 1; and L, the line length of the conductive member 2 between the open end and the connection point.

Figure 5:
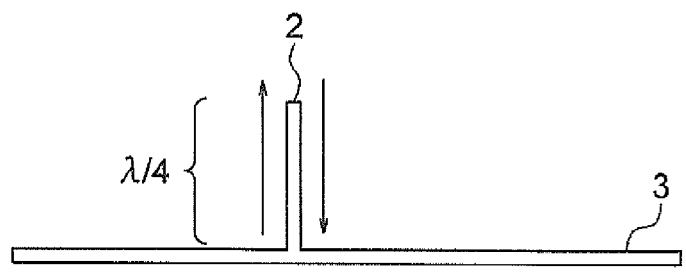
FIG. 5 is an illustration of assistance in explaining noise propagating through a conductive member 2 and the housing 3 of FIG. 1.
Figure 6:
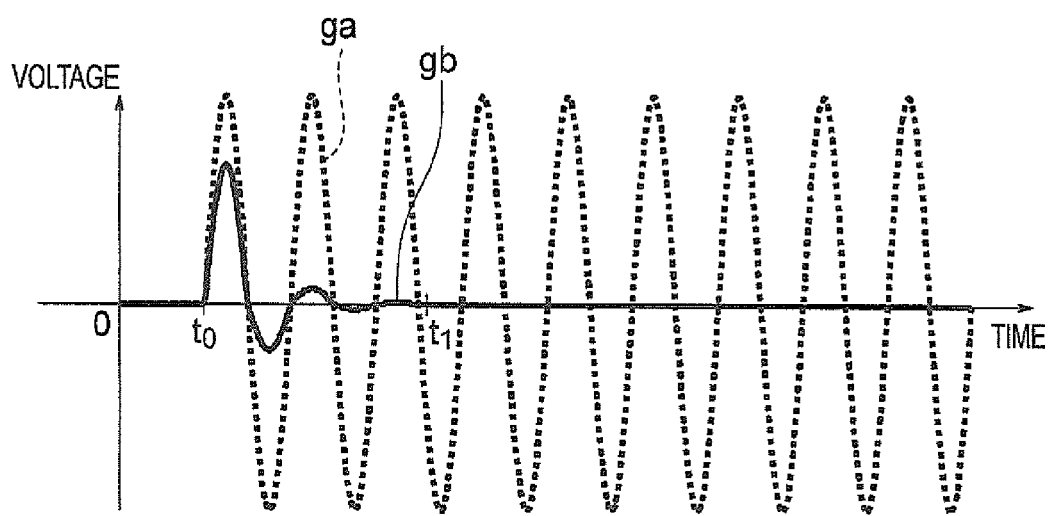
FIG. 6 is a graph representing noise characteristics of the conductive member 2 of FIG. 1 with respect to time.

The noise propagating through the conductive member 2 will be described with reference to FIGS. 5 and 6, assuming that n=1. FIG. 5 is an illustration of assistance in explaining noise propagating through the conductive member 2 and the housing 3. FIG. 6 is a graph representing noise characteristics of the conductive member 2 with respect to time. Incidentally, in FIG. 6, a line ga represents a noise waveform propagating through the conductive member 2 in a case where noise is not reflected on the conductive member 2, and a line gb represents a noise waveform propagating through the conductive member 2 in a case where noise is reflected on the conductive member 2. Incidentally, in FIG. 6, the amplitude of the noise waveform corresponds to a voltage of the conductive member 2 detected by a sensor.

As illustrated in FIG. 5, the noise propagates along the one surface of the housing 3 and into the conductive member 2 at the point of connection between the housing 3 and the conductive member 2. Then, the noise propagates from the point of connection between the housing 3 and the conductive member 2 and travels a length of $\lambda/4$, and is reflected on the open end. A reflected wave of the noise is of opposite phase to an entry wave to the open end, and thus, the reflected wave and the entry wave cancel each other out. Specifically, as illustrated in FIG. 6, waves reflected at the open end and the connection point increase with a lapse of time and cancel each other out, assuming that at time t0 the noise indicated by the line ga enters at the connection point. Thereby, the noise waveform attenuates gradually, and the line gb converges at time t1.

Figure 7:
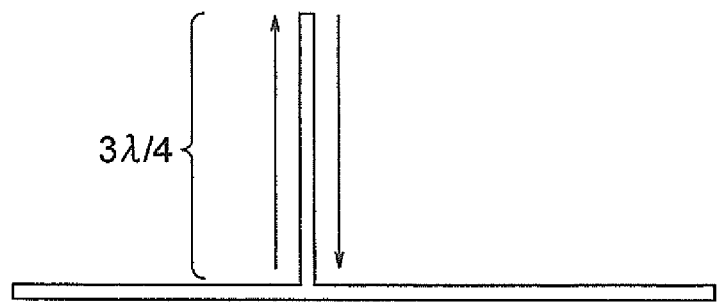
FIG. 7 is an illustration of assistance in explaining noise propagating through the conductive member 2 and the housing 3 of FIG. 1.
Figure 8:
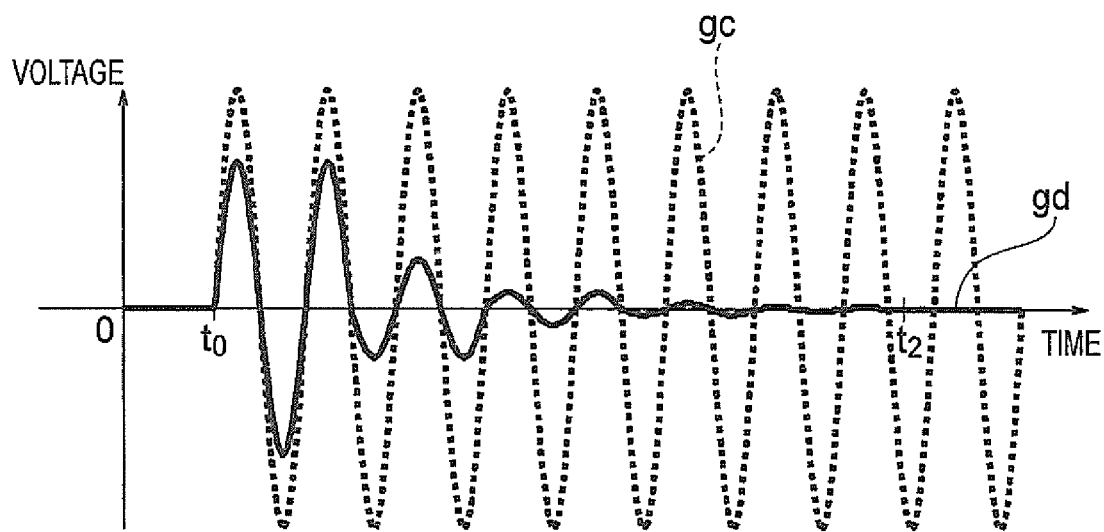
FIG. 8 is a graph representing noise characteristics of the conductive member 2 of FIG. 1 with respect to time.

Next, the noise propagating through the conductive member 2 will be described with reference to FIGS. 7 and 8, assuming that n=3. FIG. 7 is an illustration of assistance in explaining noise propagating through the conductive member 2 and the housing 3. FIG. 8 is a graph representing noise characteristics of the conductive member 2 with respect to time. Incidentally, in FIG. 8, a line gc represents a noise waveform propagating through the conductive member 2 in a case where noise is not reflected on the conductive member 2, and a line gd represents a noise waveform propagating through the conductive member 2 in a case where noise is reflected on the conductive member 2. Incidentally, in FIG. 8, the amplitude of the noise waveform corresponds to a voltage of the conductive member 2 detected by a sensor.

As illustrated in FIG. 7, the noise propagates along the one surface of the housing 3 and into the conductive member 2 at the point of connection between the housing 3 and the conductive member 2. Then, the noise propagates from the point of connection between the housing 3 and the conductive member 2 and travels a length of $3\lambda/4$, and is reflected on the open end. A reflected wave of the noise is of opposite phase to an entry wave to the open end, and thus, the reflected wave and the entry wave cancel each other out. As illustrated in FIG. 8, waves reflected at the open end and the connection point increase with a lapse of time and cancel each other out, assuming that at time t0 the noise indicated by the line gc enters at the connection point. Thereby, the noise waveform attenuates gradually, and the line gd converges at time t2. In a case where n=3, the line length of the conductive member 2 is longer and thus the time for the noise to attenuate and converge is longer, as compared to the case where n=1. In other words, a smaller value of n is desirable for a shorter time for noise attenuation.

As described above, the power conversion device of the embodiment includes the conductive member 2 connected to the housing 3 at a position at which a length thereof from the open end is $n\lambda/4$. Thereby, the noise propagating through the housing 3 by switching noise of the power module 5 is caused to propagate through the conductive member 2, and the noise is reflected by a difference in impedance at the open end of the conductive member 2. Also, the noise is reflected at the point of connection between the conductive member 2 and the housing 3. Then, in the embodiment, the length of the conductive member 2 is set so that the noises propagating through the conductive member 2 cancel each other out, and thus, the noise can be suppressed and a leakage of the noise from the housing 3 can be prevented.

Also, in the embodiment, the noise wavelength ($\lambda$) is set according to the frequency of the radiation noise radiated from the power feeder buses 11, 12 by the switching noise of the power module 5. Thereby, even in a case where, due to the shape of the power feeder buses 11, 12, the power feeder buses 11, 12 are the noise radiation sources based on the switching noise, the noise can be attenuated by the conductive member 2, and thus, the noise can be suppressed.

Incidentally, in FIG. 1, the conductive member 2 has a shape protruding from a portion of connection to the housing 3 and halfway bent in a direction parallel to the one surface of the housing 3. A length of the conductive member 2 between a portion of connection between the conductive member 2 and the housing 3 and a bending point is negligibly short, as compared to a length (or the noise wavelength $\lambda$) of other portions of the conductive member 2. Thus, in FIG. 1, the length of the conductive member 2 between the bending point and the open end is indicated as $n\lambda/4$ in order to facilitate illustration. Substantially, the length between the portion of connection between the conductive member 2 and the housing 3 and the open end is defined as $n\lambda/4$.

Incidentally, in the embodiment, the line length of the conductive member 2 is described by way of example as n=1 and n=3; however, n may be an odd number equal to or more than 5.

[Second Embodiment]

Figure 9:
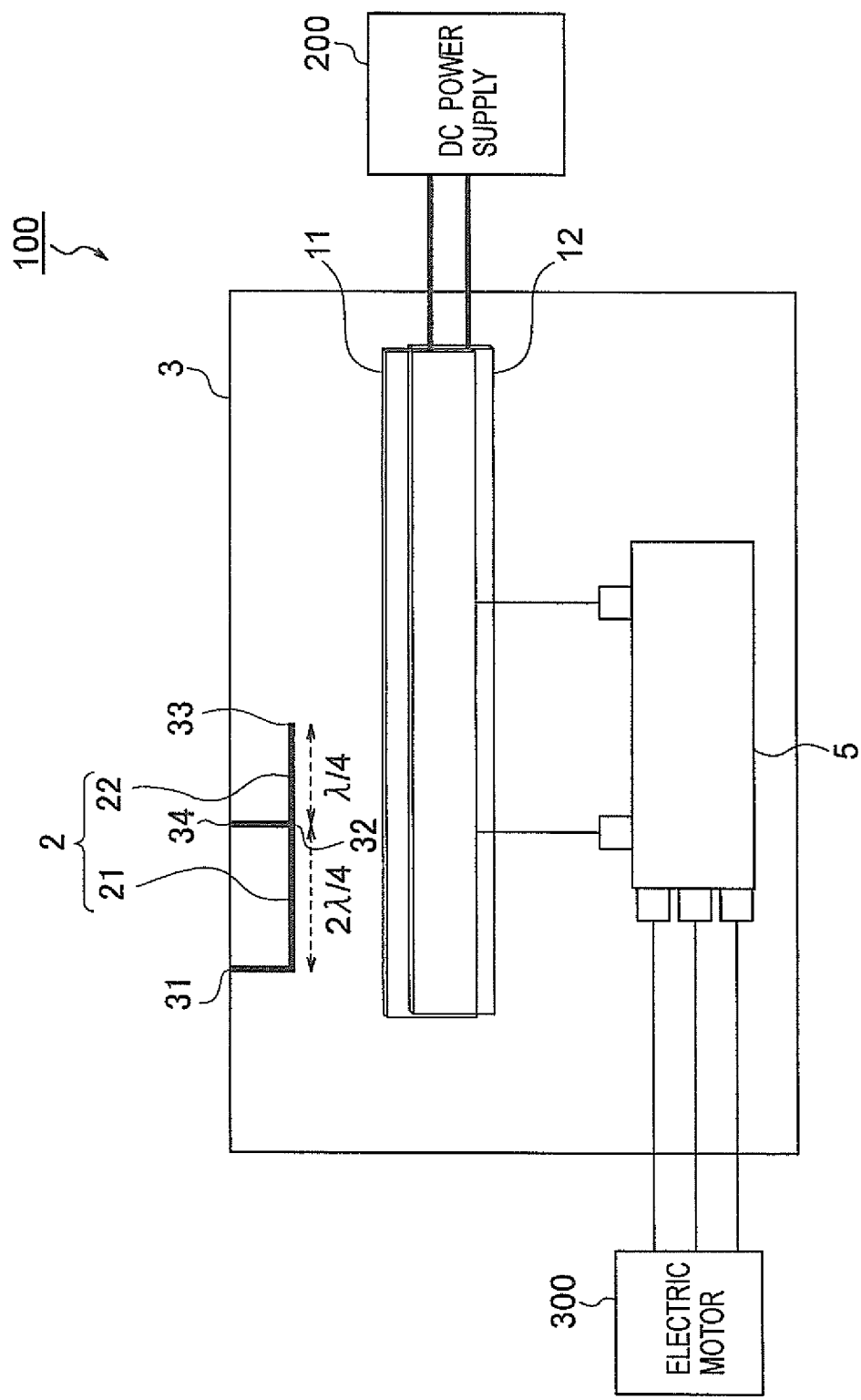
FIG. 9 is a schematic diagram illustrating a drive system for an electric vehicle including a power conversion device according to a second embodiment of the present invention.
Figure 10:
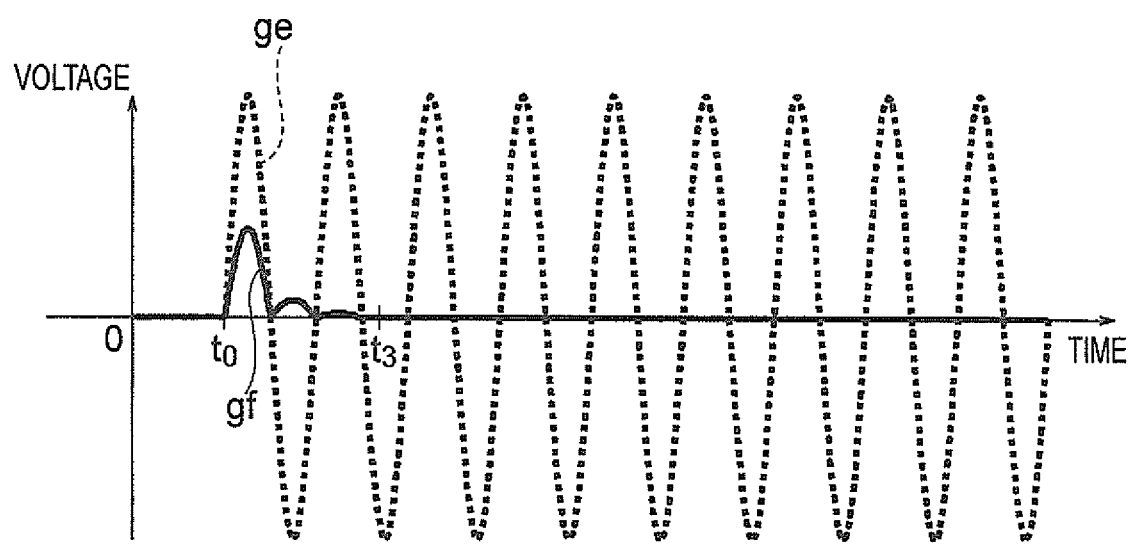
FIG. 10 is a graph representing noise characteristics of the conductive member 2 of FIG. 9 with respect to time.

A drive system for an electric vehicle including a power conversion device according to a second embodiment of the present invention will be described with reference to FIG. 9. FIG. 10 is a graph representing noise characteristics of the conductive member 2 with respect to time. The second embodiment is different in the configuration of the conductive member 2 from the above-mentioned first embodiment. Since the remaining configuration is the same as that of the above-mentioned first embodiment, description thereof will be incorporated as appropriate. Incidentally, in FIG. 9, illustration of part of the power conversion device 100 and the shielded wires 7, 8 is omitted. In FIG. 10, a line ge represents a noise waveform propagating through the conductive member 2 in a case where noise is not reflected on the conductive member 2, and a line gf represents a noise waveform propagating through the conductive member 2 in a case where noise is reflected on the conductive member 2. Incidentally, in FIG. 10, the amplitude of the noise waveform corresponds to a voltage of the conductive member 2 detected by a sensor.

As illustrated in FIG. 9, the conductive member 2 includes a first conductive portion 21 having a length of $2\lambda/4$, and a second conductive portion 22 having a length of $\lambda/4$. The length of the first conductive portion 21 between a first point 31 of connection to the housing 3 and a branch point 32 is $2\lambda/4$. The length of the second conductive portion 22 between the branch point 32 and an open end 33 is $\lambda/4$. Also, a point of connection between the first conductive portion 21 and the second conductive portion 22 forms the branch point 32, and the connection point is connected to the housing 3. The first conductive portion 21 and the second conductive portion 22 are integrally formed.

Noise propagating through the conductive member 2 will be described. The noise propagating along the one surface of the housing 3 enters also at a second point 34 of connection of the first conductive portion 21 and the second conductive portion 22 to the housing 3, while entering at the first point 31 of connection of the first conductive portion 21 to the housing 3. A length between the second connection point 34 and the open end 33 of the conductive member 2 is shorter than a length between the first connection point 31 and the open end 33 of the conductive member 2. Thus, first, noise entering at the second connection point 34 is reflected by the open end 33, and a reflected wave and an entry wave to the open end 33 cancel each other out. Also, the reflected wave interferes also with noise propagating from the first connection point 31 through the first conductive portion 21 and the second conductive portion 22, and the reflected wave and the noise cancel each other out. As illustrated in FIG. 10, waves reflected at the open end 33 and the connection points 31, 34 increase with a lapse of time and cancel each other out, assuming that at time t0 the noise indicated by the line ge enters at the connection points 31, 34. Thereby, the noise waveform attenuates gradually, and the line gf converges at time t3.

The conductive member 2 of the first embodiment illustrated in FIG. 7 has only one point of connection to the housing 3. On the other hand, the conductive member 2 of the second embodiment has more noise reflection points because of having the second connection point 34. Thus, the noise attenuation time can become shorter as compared to the noise attenuation time (which corresponds to the time t2 illustrated in FIG. 8) in the conductive member 2 which does not have the second conductive portion 22.

In the second embodiment, as described above, the conductive member 2 is branched from the open end 33 into plural branches by a length of λ/4, and one of the plural branches is connected to the housing 3 at the second connection point 34. Then, the other of the plural branches is connected to the housing 3 at the first connection point 31. Thereby, the conductive member 2 is connected to the housing 3 at plural points (31, 34), and thus, the noise attenuation time can be reduced, the noise based on the switching noise can be suppressed, and the leakage of the noise from the housing 3 can be prevented.

Incidentally, in the second embodiment, the conductive member 2 is branched and connected to the housing 3 at a position at which a length thereof from the open end 33 is λ/4; however, the conductive member 2 may be branched at a length (L) which satisfies Equation (4), from the open end 33:

$$L = \frac{m\lambda}{4} \quad (4)$$

where m is an odd number equal to or more than 1.

Incidentally, the length of the conductive member 2 illustrated in FIG. 9 between the first connection point 31 and the bending point of the conductive member 2, and the length of the conductive member 2 between the second connection point 34 and the branch point 32 of the conductive member 2 are negligibly short, as compared to the length (or the noise wavelength λ) of other portions of the conductive member 2. Thus, in FIG. 9, the length of the conductive member 2 between the bending point and the branch point 32 is indicated as 2λ/4, and the length of the conductive member 2 between the branch point 32 and the open end 33 is indicated as λ/4, in order to facilitate illustration. Substantially, the length between the first connection point 31 and the open end 33 and the length between the second connection point 34 and the open end 33 are defined as nλ/4.

[Third Embodiment]

Figure 11:
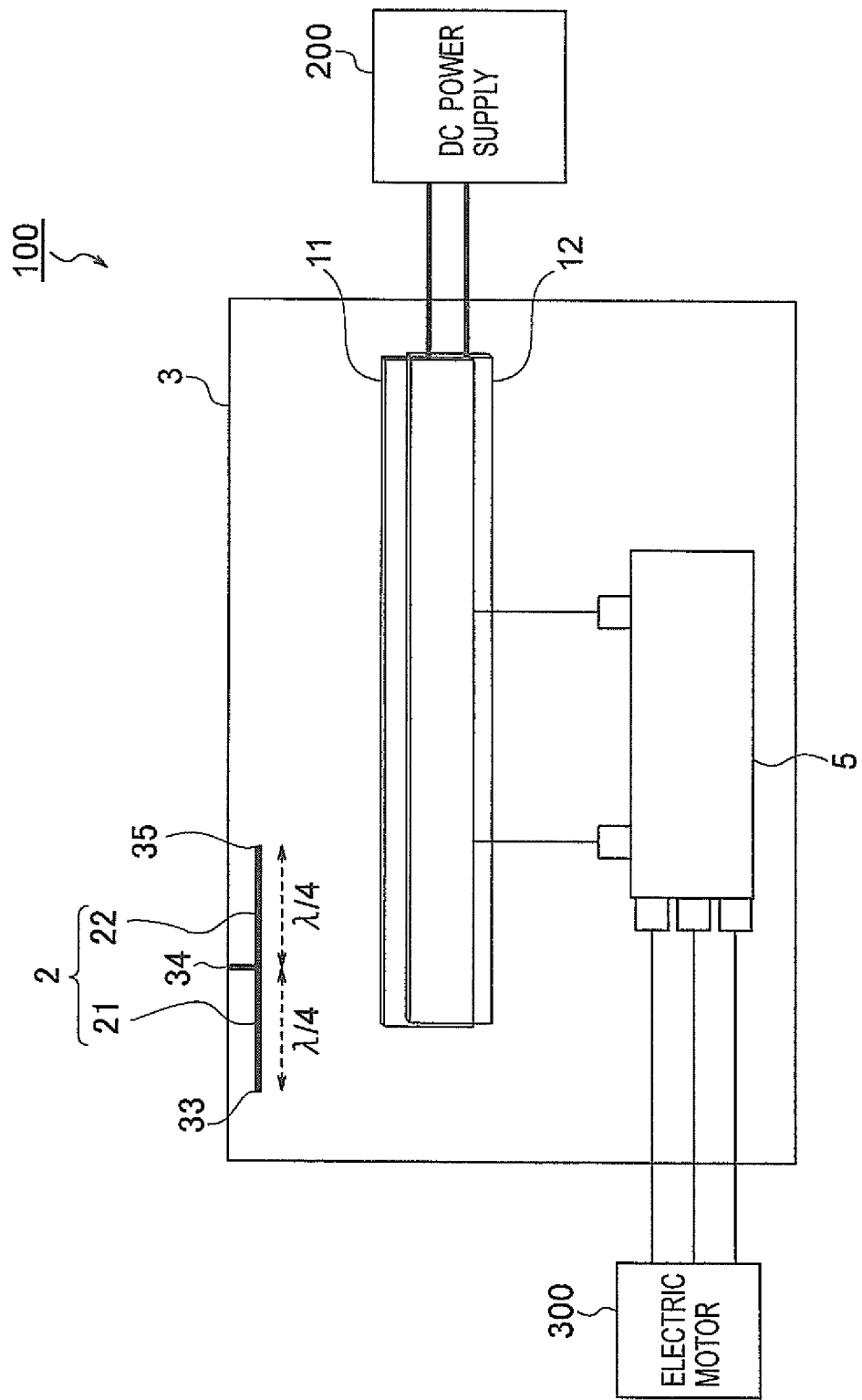
FIG. 11 is a schematic diagram illustrating a drive system for an electric vehicle including a power conversion device according to a third embodiment of the present invention.
Figure 12:
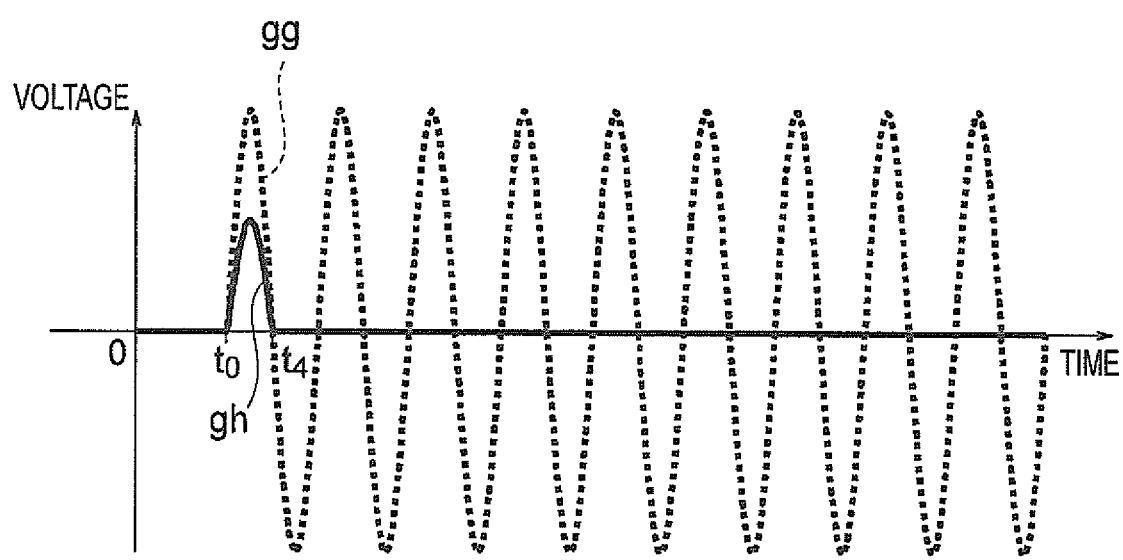
FIG. 12 is a graph representing noise characteristics of the conductive member 2 of FIG. 11 with respect to time.

A drive system for an electric vehicle including a power conversion device according to a third embodiment of the present invention will be described with reference to FIG. 11. FIG. 12 is a graph representing noise characteristics of the conductive member with respect to time. The third embodiment is different in the configuration of the conductive member 2 from the above-mentioned first embodiment. Since the remaining configuration is the same as that of the above-mentioned first embodiment, description of the first and second embodiments will be incorporated as appropriate. Incidentally, in FIG. 11, illustration of part of the power conversion device 100 and the shielded wires 7, 8 is omitted. In FIG. 12, a line gg represents a noise waveform propagating through the conductive member 2 in a case where noise is not reflected on the conductive member 2, and a line gh represents a noise waveform propagating through the conductive member 2 in a case where noise is reflected on the conductive member 2. Incidentally, in FIG. 12, the amplitude of the noise waveform corresponds to a voltage of the conductive member 2 detected by a sensor.

As illustrated in FIG. 11, the conductive member 2 includes the first conductive portion 21 having a length of λ/4 between the open end 33 and the point 34 of connection to the housing 3, and the second conductive portion 22 having a length of λ/4 between an open end 35 (or a second open end), which is different from the open end 33 of the first conductive portion 21, and the point 34 of connection to the housing 3. Also, the first conductive portion 21 and the second conductive portion 22 include a conductive portion in the form of a straight line. The straight-line conductive portion is branched and connected to the housing 3 at an intermediate point between the open end 33 of the first conductive portion 21 and the open end 35 of the second conductive portion 22. In other words, the conductive member 2 is branched into plural branches at a position at which a length thereof from the open end 33 of the first conductive portion 21 is λ/4, and one of the plural branches is connected to the housing 3 at the connection point 34. Then, the conductive member 2 has the open end 35 of the second conductive portion 22 formed in the other of the plural branches, and is connected to the housing 3 at a position at which a length thereof from the open end 35 is λ/4. Also, the straight-line conductive portion is provided at a given interval from the one surface of the housing 3.

Noise propagating through the conductive member 2 will be described. The noise propagating along the one surface of the housing 3 enters at the point 34 of connection between the conductive member 2 and the housing 3 and branches off at the branch point of the conductive member 2, and the branched noises travel toward the open end 33 of the first conductive portion 21 and toward the open end 35 of the second conductive portion 22, respectively. Then, the noises are reflected on the open ends 33, 35 and thereby are of opposite phases, and the noise entering the open ends 33, 35 and the noise reflected from the open ends 33, 35 interfere with and cancel each other out. As illustrated in FIG. 12, the noise indicated by the line gh converges at time t4, assuming that at the time t0 the noise indicated by the line gg enters at the open ends 33, 35. In the third embodiment, the noises are reflected by the open ends 33, 35 at the same time and cancel each other out, and thus, the attenuation time until the noise converges can be reduced.

In the third embodiment, as described above, the conductive member 2 is connected to the housing 3 at a position at which a length thereof from each of the plural open ends 33, 35 is λ/4. Thereby, the conductive member 2 has the plural open ends 33, 35, and thus, the noise attenuation time can be reduced, the noise based on the switching noise can be suppressed, and the leakage of the noise from the housing 3 can be prevented.

Figure 13:
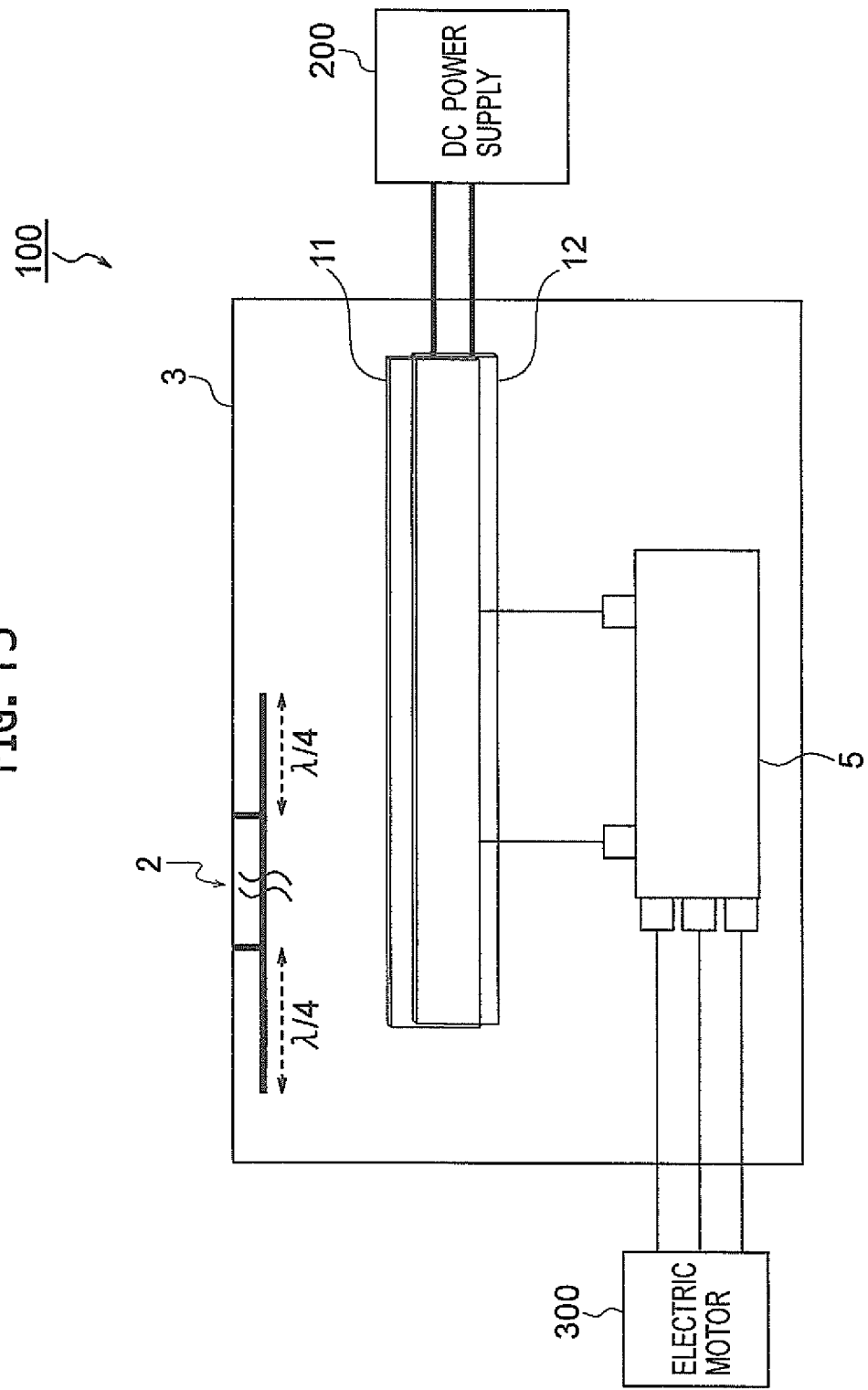
FIG. 13 is a schematic diagram illustrating a drive system for an electric vehicle including a power conversion device according to a modification of the embodiment of the present invention.

Incidentally, in the third embodiment, the conductive member 2 has one branch point; however, as illustrated in FIG. 13, the conductive member 2 may have plural branch points. In this case, the conductive member 2 can be connected to the housing 3 at positions corresponding to the branch points. FIG. 13 is a schematic diagram illustrating a drive system for an electric vehicle including a power conversion device according to a modification of the embodiment of the present invention.

Incidentally, in the modification, the length between the plural open ends 33, 35 and the point of connection to the housing 3 may be set to nλ/4, where n is an odd number equal to or more than 1.

Incidentally, the length of the conductive member 2 illustrated in FIGS. 11 and 13 between the point of connection to the housing 3 and the branch point of the conductive member 2 is negligibly short, as compared to the length (or the noise wavelength λ) of other portions of the conductive member 2. Thus, in FIGS. 11 and 13, the length of the conductive member 2 between the open ends 33, 35 and the branch point is indicated as λ/4 in order to facilitate illustration; however, substantially, the length between the point of connection to the housing 3 and the open ends 33, 35 is defined as nλ/4.

[Fourth Embodiment]

A drive system for an electric vehicle including a power conversion device according to a fourth embodiment of the present invention will be described with reference to FIG. 14. FIG. 15 is a plan view illustrating the conductive member 2. The fourth embodiment is different in the configuration of the conductive member 2 from the above-mentioned first embodiment. Since the remaining configuration is the same as that of the above-mentioned first embodiment, description of the first to third embodiments will be incorporated as appropriate. Incidentally, in FIG. 14, illustration of part of the power conversion device 100 and the shielded wires 7, 8 is omitted.

Figure 14:
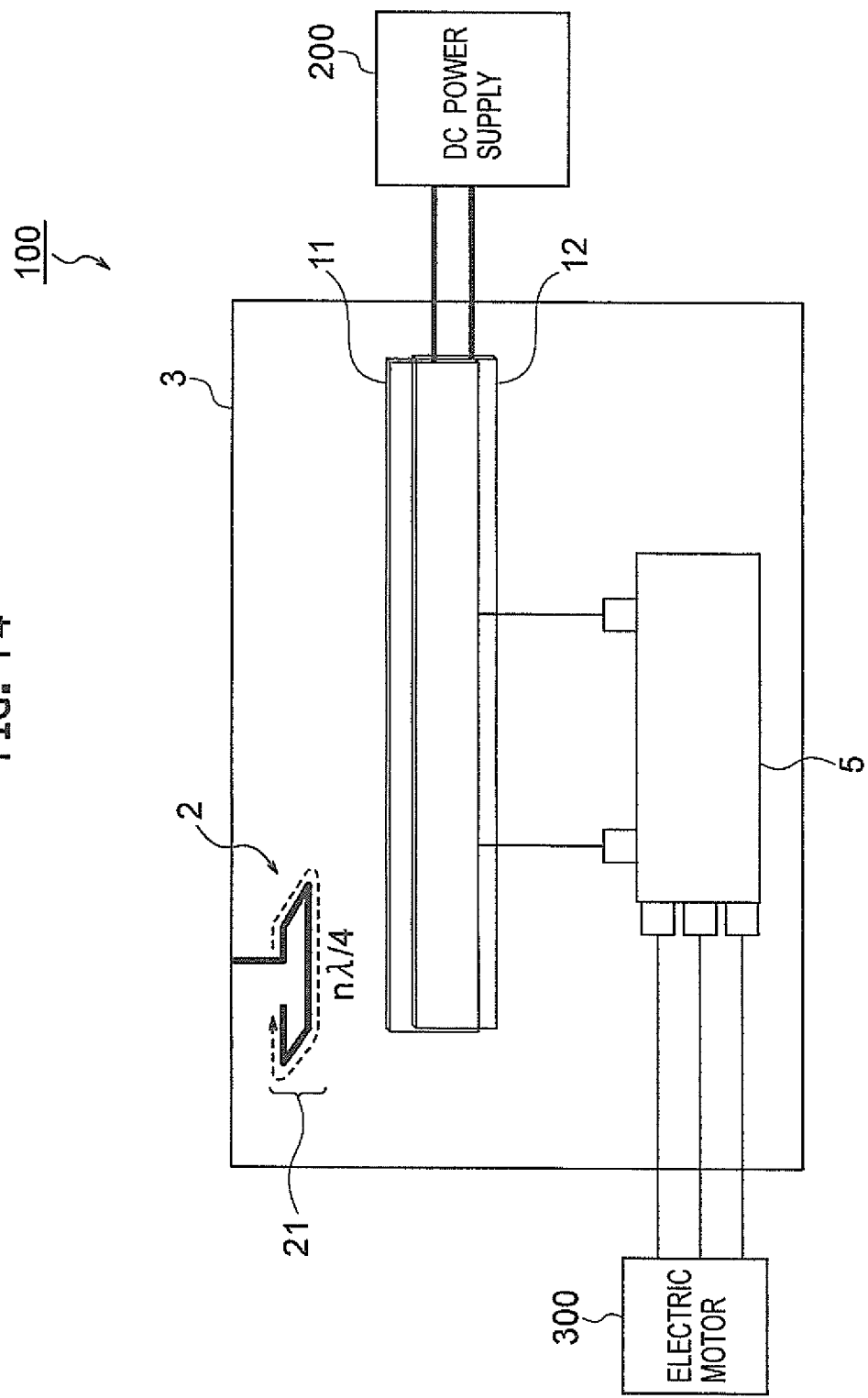
FIG. 14 is a schematic diagram illustrating a drive system for an electric vehicle including a power conversion device according to a fourth embodiment of the present invention.
Figure 15:
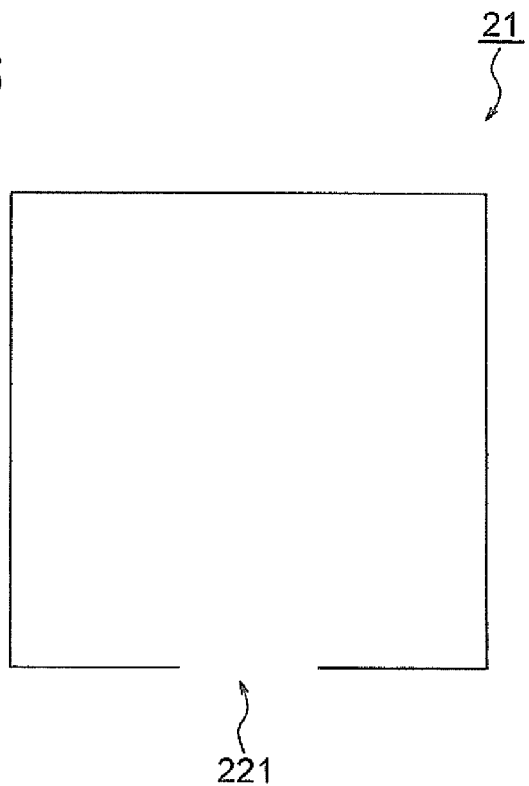
FIG. 15 is a plan view illustrating the conductive member 2 of FIG. 14.

As illustrated in FIGS. 14 and 15, the conductive member 2 includes the conductive portion 21 formed in linear shape in a plane parallel to the one surface of the housing 3 including the point of connection to the housing 3, and formed in a rectangular shape partially having a gap 221. The gap 221 is formed in a central portion of one of four sides of the conductive portion 21. The conductive portion 21 is formed by bending one electrical conductor. One end of the conductive portion 21 is connected to the housing 3, and the other end of the conductive portion 21 is configured as an open end. A length between the open end of the conductive portion 21 and the point of connection to the housing 3 is $n\lambda/4$, where n is an odd number equal to or more than 1.

Noise propagating through the conductive member 2 will be described. The noise propagating along the one surface of the housing 3 enters the conductive member 2 at the point of connection to the housing 3 and propagates toward the open end of the conductive portion 21. Then, the noise is reflected on the open end and thus is of opposite phase, and the noise entering the open end and the noise reflected from the open end interfere with each other and cancel each other out.

Also, the conductive member 2 is formed in the plane parallel to the one surface of the housing 3 in such a way as to surround the one surface of the housing 3. Thus, noise is reduced in a region where the shape of the conductive portion 21 is projected on the one surface of the housing 3.

In the fourth embodiment, as described above, the conductive member 2 is formed in linear shape and is also formed in the rectangular shape partially having the gap 221. Thus, the noises are reflected on the open end formed by the provision of the gap 221 and cancel each other out. Thus, the noise based on the switching noise can be suppressed, and the leakage of the noise from the housing 3 can be prevented. Also, the conductive portion 21 is formed in such a way as to surround the one surface of the housing 3, at a predetermined distance from a portion of the one surface of the housing 3. Thus, a region where the one surface of the housing 3 is affected little by the influence of the noise can be formed.

Figure 16:
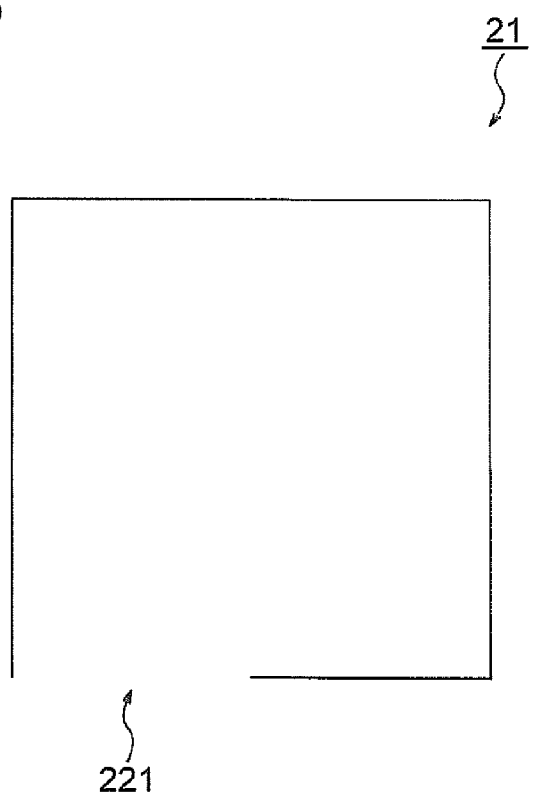
FIG. 16 is a plan view illustrating the conductive member 2 according to a modification of the embodiment of the present invention.

Incidentally, in the fourth embodiment, as illustrated in FIG. 16, the gap 221 may be formed in an end portion of one of the four sides of the conductive portion 21. FIG. 16 is a plan view of the conductive member 2 according to a modification of the embodiment of the present invention. Incidentally, it is desirable that the length of the gap 221 illustrated in FIGS. 15 and 16 be reduced unless interference by the leakage of noise occurs between ends of the gap 221.

Incidentally, in this modification, the conductive portion 21 is formed in the rectangular shape; however, the conductive portion 21 may have a triangular shape or other polygonal shapes.

Incidentally, in the conductive member 2 illustrated in FIG. 14, the length of the conductive member 2 between the point of connection to the housing 3 and the bending point nearest to the connection point is negligibly short as compared to the length (or the noise wavelength $\lambda$) of other portions of the conductive member 2. Thus, in FIG. 14, the length of the conductive portion 21 in the plane parallel to the one surface of the housing 3 is indicated as $n\lambda/4$ in order to facilitate illustration. Substantially, the length between the portion of connection to the housing 3 and the open end is defined as $n\lambda/4$.

[Fifth Embodiment]

A drive system for an electric vehicle including a power conversion device according to a fifth embodiment of the present invention will be described with reference to FIG. 17. FIG. 18 is a plan view of the conductive member 2. The fifth embodiment is different in the configuration of the conductive member 2 from the above-mentioned first embodiment. Since the remaining configuration is the same as that of the above-mentioned first embodiment, description of the first to fourth embodiments will be incorporated as appropriate. Incidentally, in FIG. 17, illustration of part of the power conversion device 100 and the shielded wires 7, 8 is omitted.

Figure 17:
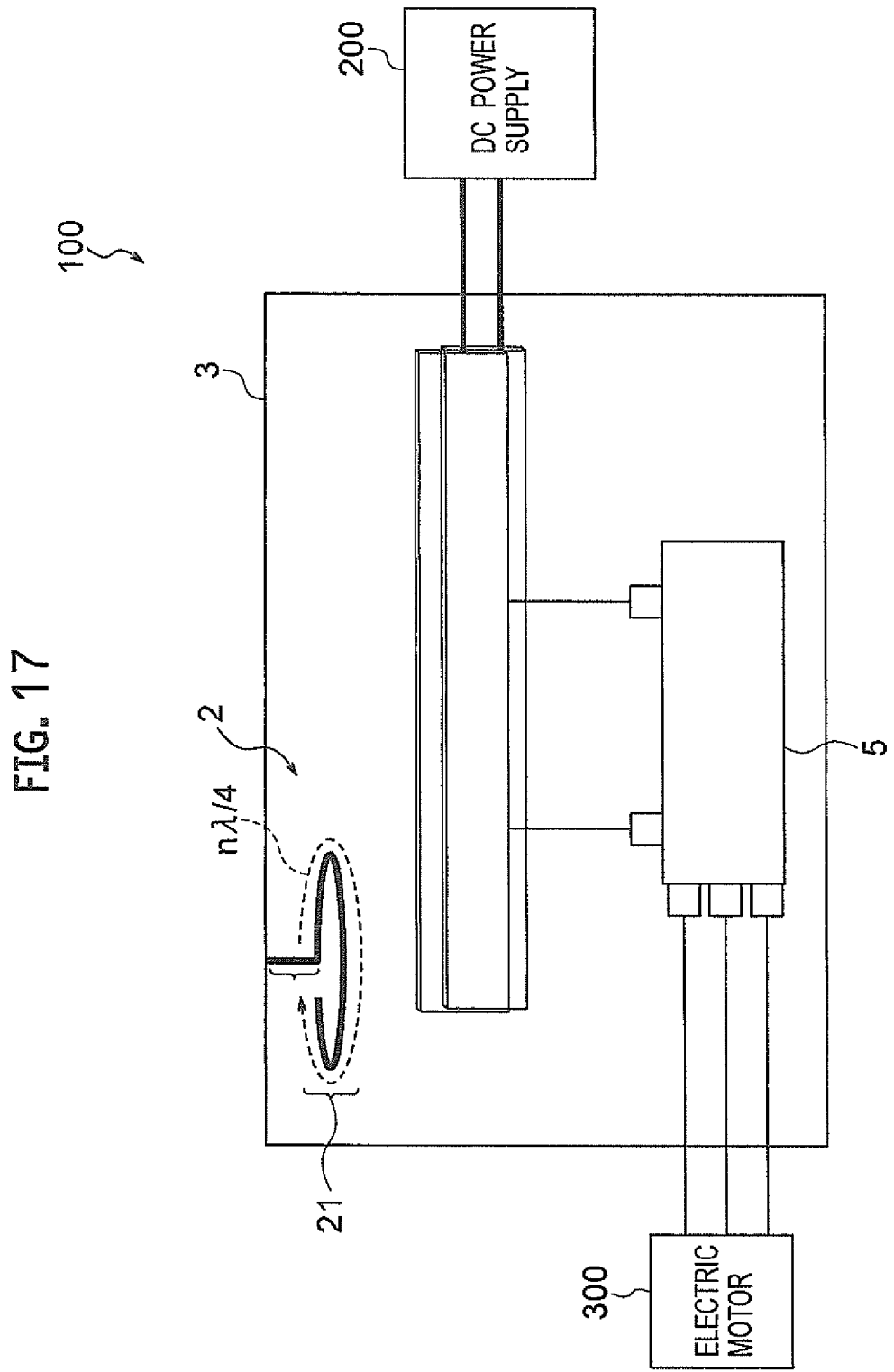
FIG. 17 is a schematic diagram of a drive system for an electric vehicle including a power conversion device according to a fifth embodiment of the present invention.
Figure 18:
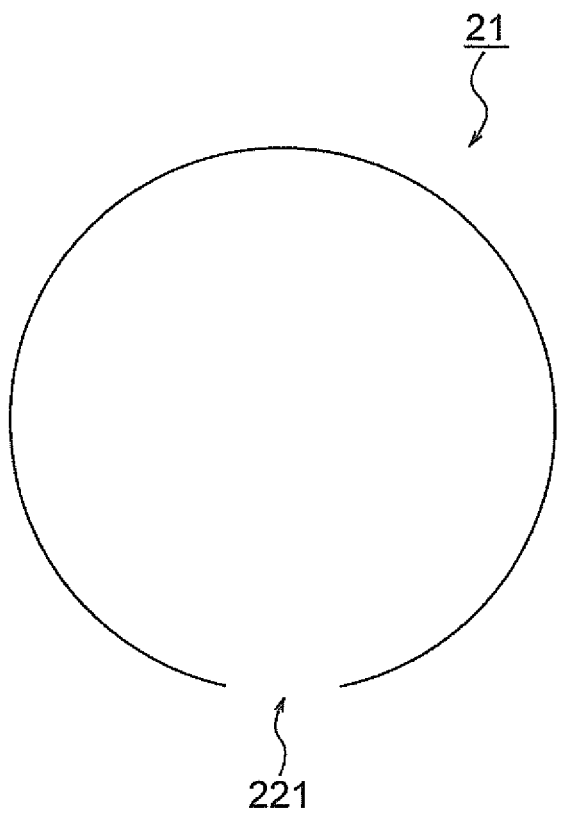
FIG. 18 is a plan view illustrating the conductive member 2 of FIG. 17.

As illustrated in FIGS. 17 and 18, the conductive member 2 includes the conductive portion 21 formed in linear shape in the plane parallel to the one surface of the housing 3 including the point of connection to the housing 3, and formed in a loop shape (or a circular shape) partially having the gap 221. The gap 221 is formed in a portion of the circle of the conductive portion 21. The conductive portion 21 is made of one electrical conductor. One end of the conductive portion 21 is connected to the housing 3, and the other end of the conductive portion 21 is configured as an open end. A length between the open end of the conductive portion 21 and the point of connection to the housing 3 is $n\lambda/4$, where n is an odd number equal to or more than 1.

Figure 19:
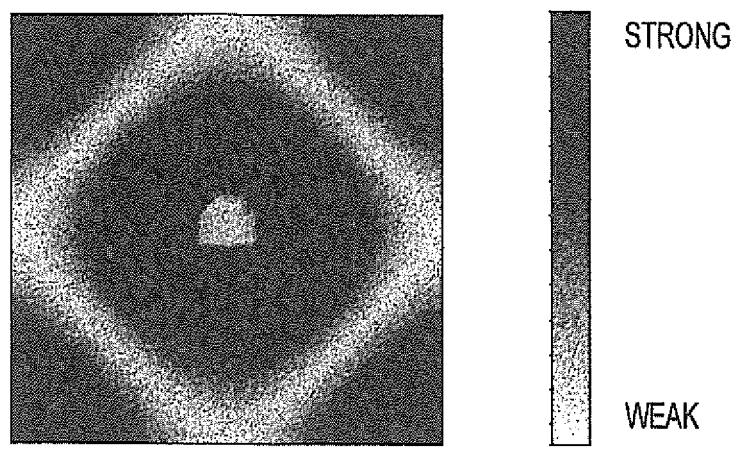
FIG. 19 is a graph representing a noise distribution on the one surface of the housing 3 of FIG. 17.

Also, the conductive member 2 is formed in the plane parallel to the one surface of the housing 3 in such a way as to surround a portion of the one surface of the housing 3. FIG. 19 illustrates a noise distribution on the one surface of the housing 3 on which the conductive member 2 is provided. On the one surface of the housing 3, noise is reduced in a portion corresponding to a central portion of the conductive portion 21 having the circular shape.

In the fifth embodiment, as described above, the conductive member 2 is formed in linear shape and is also formed in the circular shape partially having the gap 221. Thus, the noises are reflected on the open end formed by the provision of the gap 221 and cancel each other out. Thus, the noise based on the switching noise can be suppressed, and the leakage of the noise from the housing 3 can be prevented. Also, the conductive portion 21 is formed in such a way as to surround the portion of the one surface of the housing 3, in the portion of the one surface of the housing 3, and thus, a region where the one surface of the housing 3 is affected little by the influence of the noise can be formed.

Figure 20:
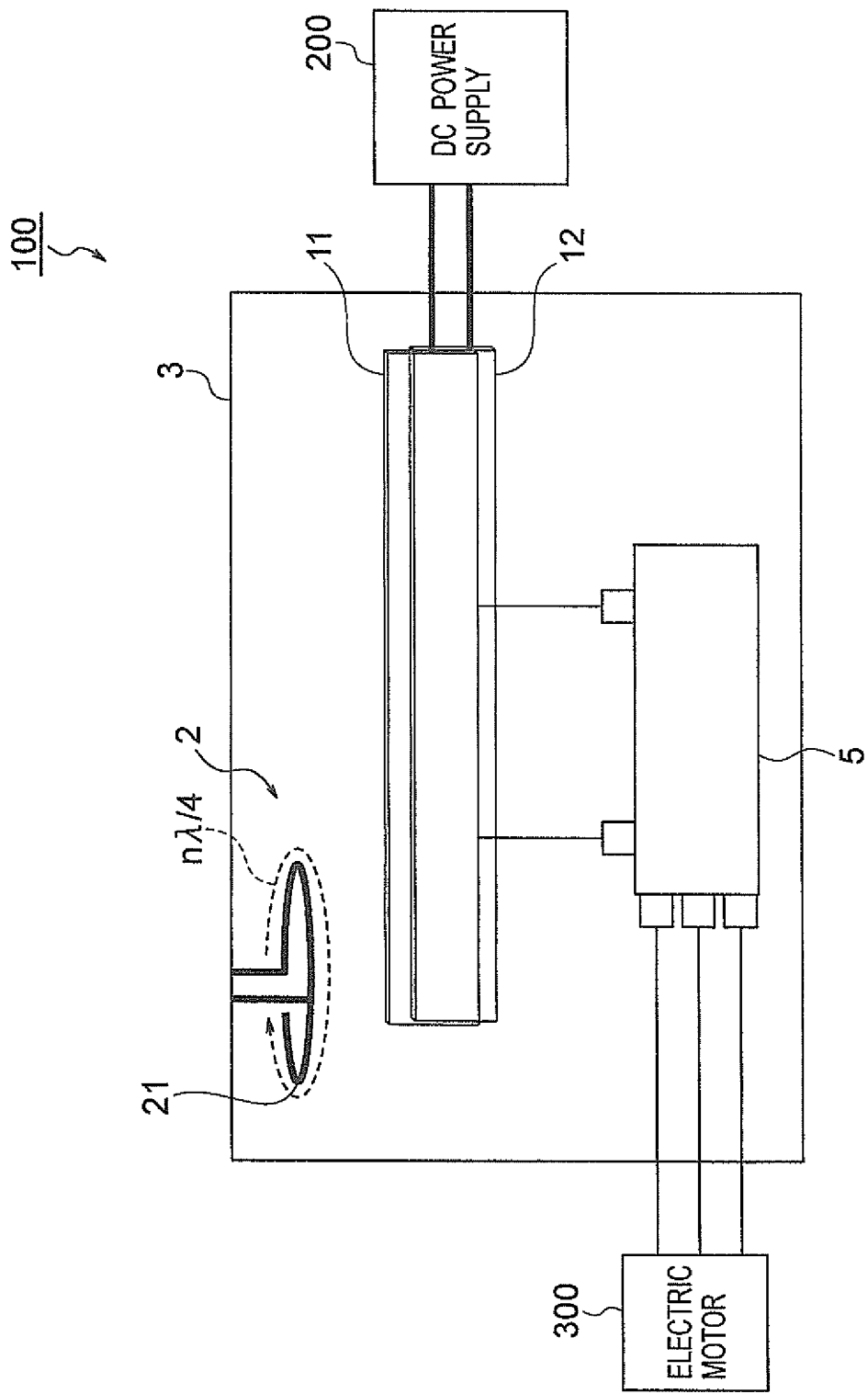
FIG. 20 is a schematic diagram illustrating a drive system for an electric vehicle including a power conversion device according to a modification of the embodiment of the present invention.

Incidentally, as illustrated in FIG. 20, in the fifth embodiment, the conductive member 2 may be configured so that the conductive portion 21 and the housing 3 are connected at plural points. FIG. 20 is a schematic diagram illustrating a drive system including the conductive member 2 according to a modification of the embodiment of the present invention.

Incidentally, in the conductive member 2 illustrated in FIG. 17, the length of the conductive member 2 between the point of connection to the housing 3 and the bending point is negligibly short as compared to the length (or the noise wavelength $\lambda$) of other portions of the conductive member 2. Thus, in FIG. 17, the length of the conductive portion 21 in the plane parallel to the one surface of the housing 3 is indicated as $n\lambda/4$ in order to facilitate illustration. Substantially, the length between the portion of connection to the housing 3 and the open end is defined as $n\lambda/4$.

[Sixth Embodiment]

A drive system for an electric vehicle including a power conversion device according to a sixth embodiment of the present invention will be described with reference to FIG. 21. FIG. 22 is a plan view of the conductive member 2. The sixth embodiment is different in the configuration of the conductive member 2 from the above-mentioned first embodiment. Since the remaining configuration is the same as that of the above-mentioned first embodiment, description of the first to fifth embodiments will be incorporated as appropriate. Incidentally, in FIG. 21, illustration of part of the power conversion device 100 and the shielded wires 7, 8 is omitted.

Figure 21:
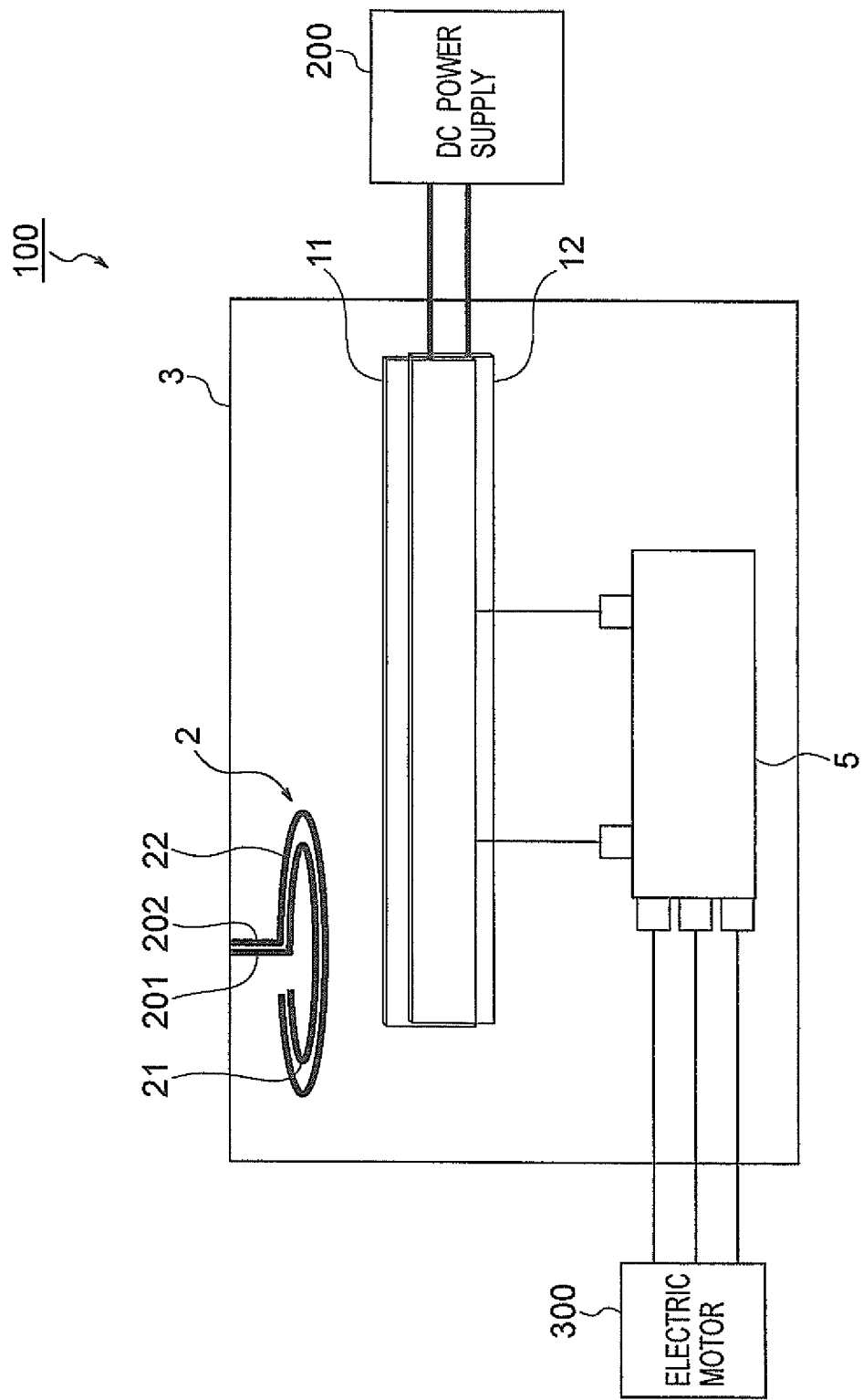
FIG. 21 is a schematic diagram of a drive system for an electric vehicle including a power conversion device according to a sixth embodiment of the present invention.
Figure 22:
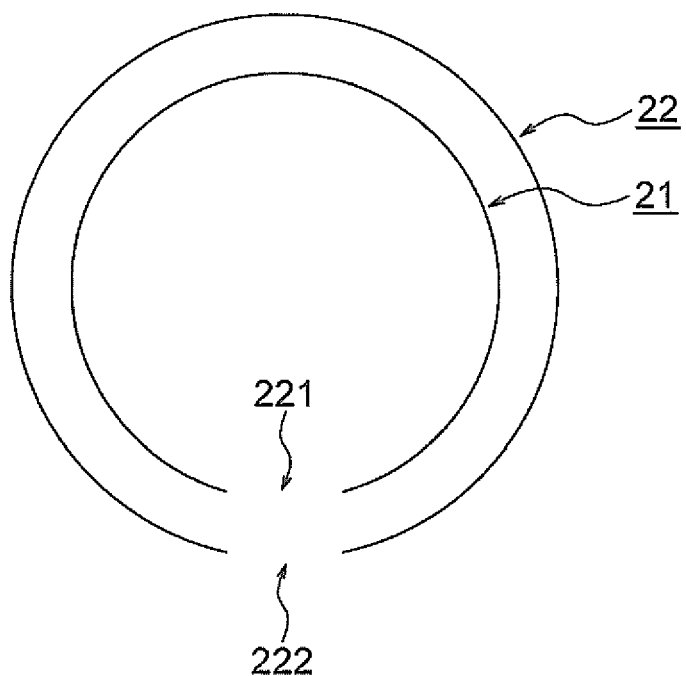
FIG. 22 is a plan view illustrating the conductive member 2 of FIG. 21.

As illustrated in FIGS. 21 and 22, the conductive member 2 includes a first conductive member 201, and a second conductive member 202. The first conductive member 201 includes the first conductive portion 21 formed in linear shape in the plane parallel to the one surface of the housing 3 including the point of connection to the housing 3, and formed in a loop shape (or a circular shape) partially having the gap 221. The second conductive member 202 includes the second conductive portion 22 formed in a loop shape (or a circular shape) partially having a gap 222. The shape of the second conductive portion 22 is similar to that of the first conductive portion 21. The length of the second conductive member 202 is greater than that of the first conductive member 201. The length of the second conductive member 202 is $3\lambda/4$, and the length of the first conductive member 201 is $\lambda/4$.

In the plane parallel to the one surface of the housing 3, the second conductive portion 22 is arranged outward of the first conductive portion 21. The first conductive portion 21 and the second conductive portion 22 are arranged in such a manner that a point of center of the first conductive portion 21 and a point of center of the second conductive portion 22 are located at the same position. The gap 222 of the second conductive portion 22 is arranged outward of the gap 221 of the first conductive portion 21.

Figure 23:
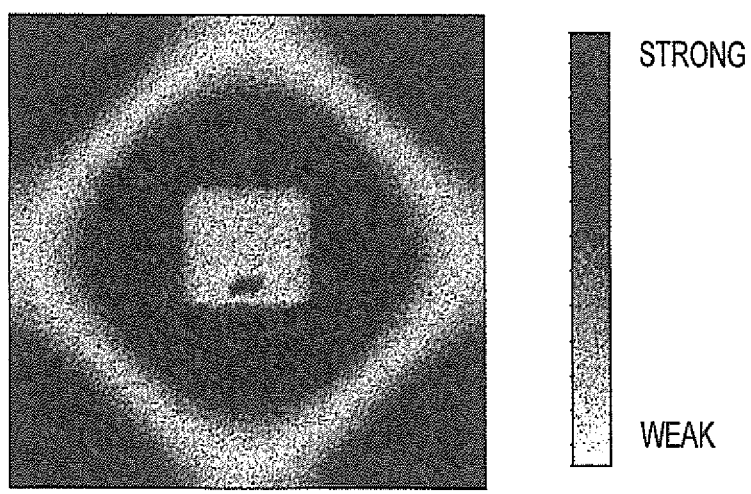
FIG. 23 is a graph representing a noise distribution on the one surface of the housing 3 of FIG. 21.

FIG. 23 illustrates a noise distribution on the one surface of the housing 3 to which the conductive member 2 is connected. On the one surface of the housing 3, noise is reduced in a portion corresponding to a central portion of the first conductive portion 21 and the second conductive portion 22 which are circular, and an area in which the noise is reduced is wider as compared to the noise distribution illustrated in FIG. 19.

In the sixth embodiment, as described above, the conductive member 2 includes the first conductive portion 21 formed in linear shape and formed in the loop shape partially having the gap 221, and the second conductive portion 22 formed in linear shape and formed in the loop shape partially having the gap 222. The first conductive portion 21 and the second conductive portion 22 have the same point of center and are arranged in the same plane. Thereby, noise can be reduced in a wide region on the one surface of the housing 3, and thus, the leakage of the noise from the housing 3 can be prevented.

Figure 24:
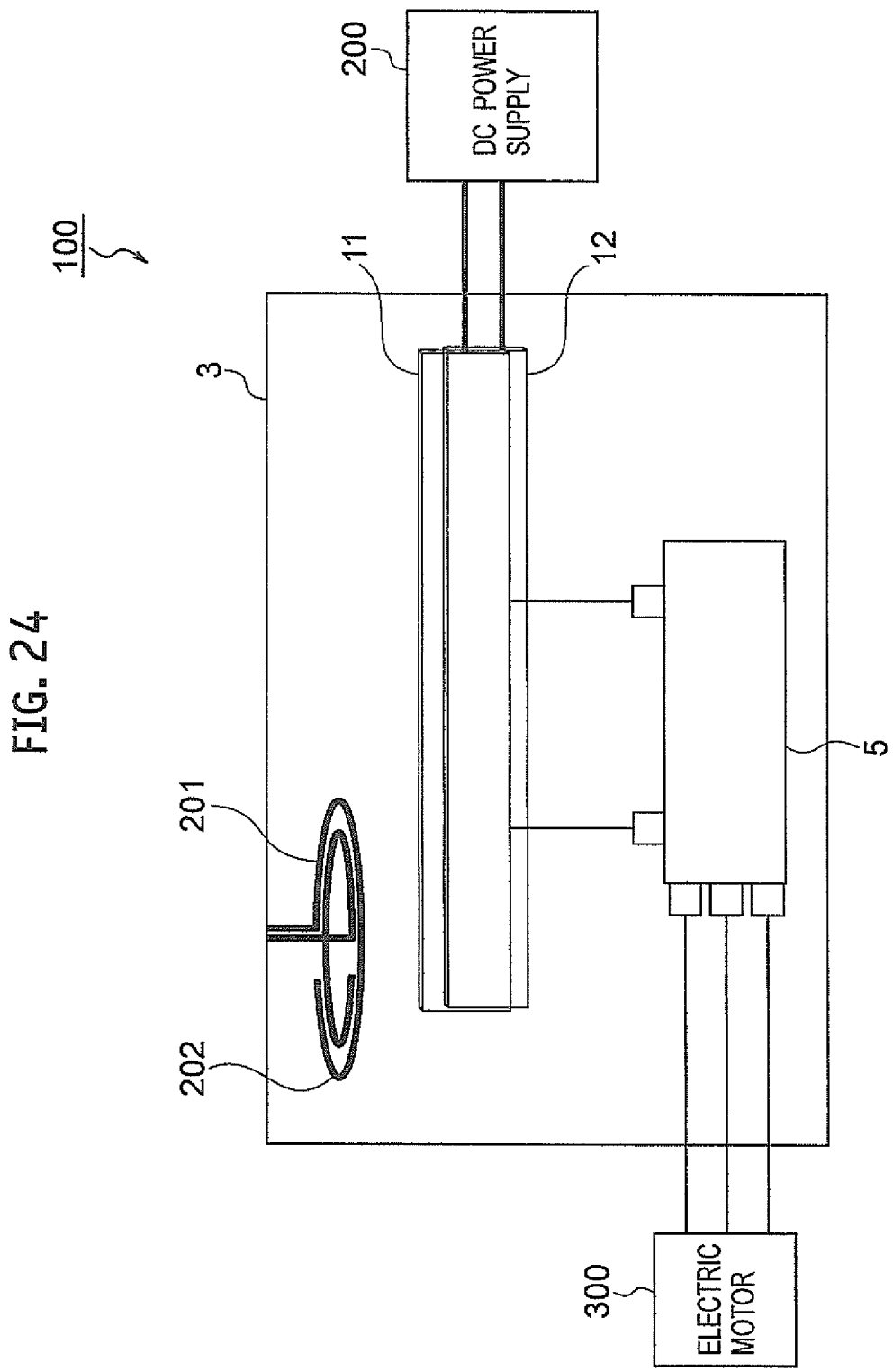
FIG. 24 is a schematic diagram illustrating a drive system for an electric vehicle including a power conversion device according to a modification of the embodiment of the present invention.
Figure 25:
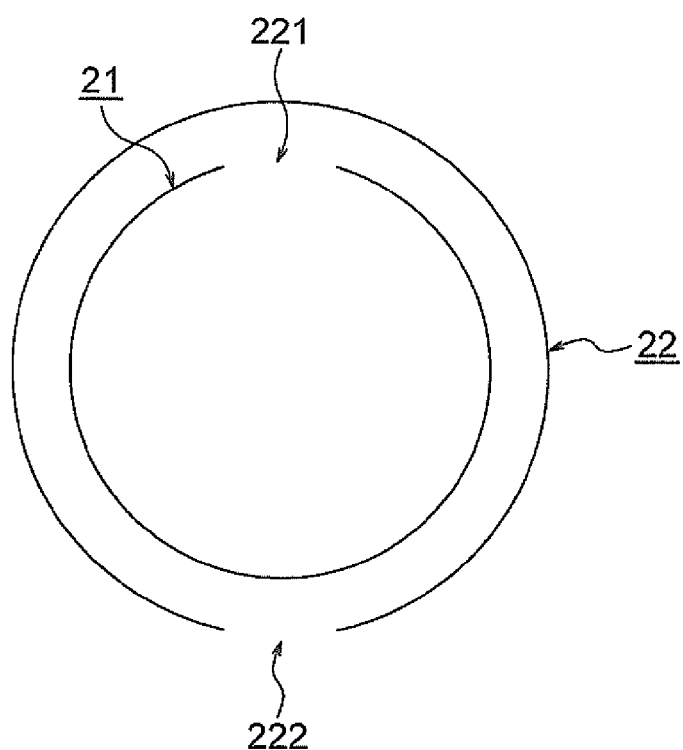
FIG. 25 is a plan view illustrating the conductive member of FIG. 24.

Incidentally, as illustrated in FIGS. 24 and 25, a portion of the second conductive portion 22, which does not have the gap 222, may be arranged outward of the gap 221 of the first conductive portion 21. FIG. 24 is a schematic diagram illustrating a drive system including the conductive member 2 according to a modification of the embodiment of the present invention. FIG. 25 is a plan view of the conductive member 2 of FIG. 24. Thereby, the portion of the second conductive portion 22, which does not have the gap 222, is arranged outward of the gap 221 of the first conductive portion 21, and thus, noise which leaks through a portion having the gap 221 is covered by the second conductive portion 22, so that the leakage of the noise can be prevented.

Figure 26:
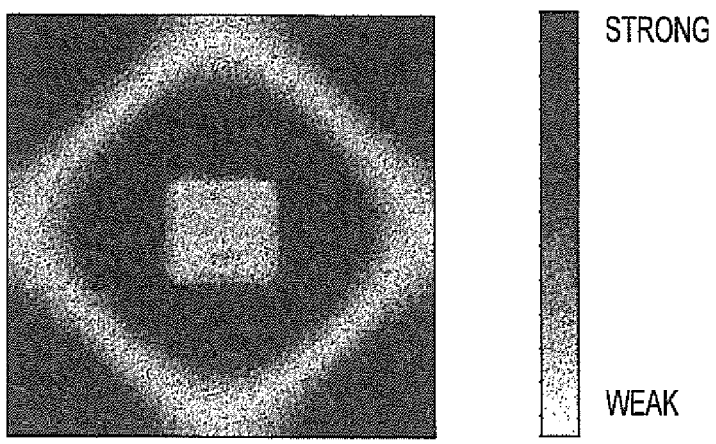
FIG. 26 is a graph representing a noise distribution on the one surface of the housing 3 of FIG. 24.

FIG. 26 illustrates a noise distribution on the one surface of the housing 3 in the modification illustrated in FIGS. 24 and 25. In the graph represented in FIG. 23, a region where noise is high is present in a portion of a central portion (or a rectangular portion at the center of FIG. 23) in which noise is reduced. Meanwhile, in the modification illustrated in FIGS. 24 and 25, as illustrated in FIG. 26, a region where noise is high is small in a central portion (or a rectangular portion at the center of FIG. 26) in which noise is reduced. The conductive member 2 according to the modification illustrated in FIGS. 24 and 25 is provided thereby to prevent the leakage of the noise.

Figure 27:
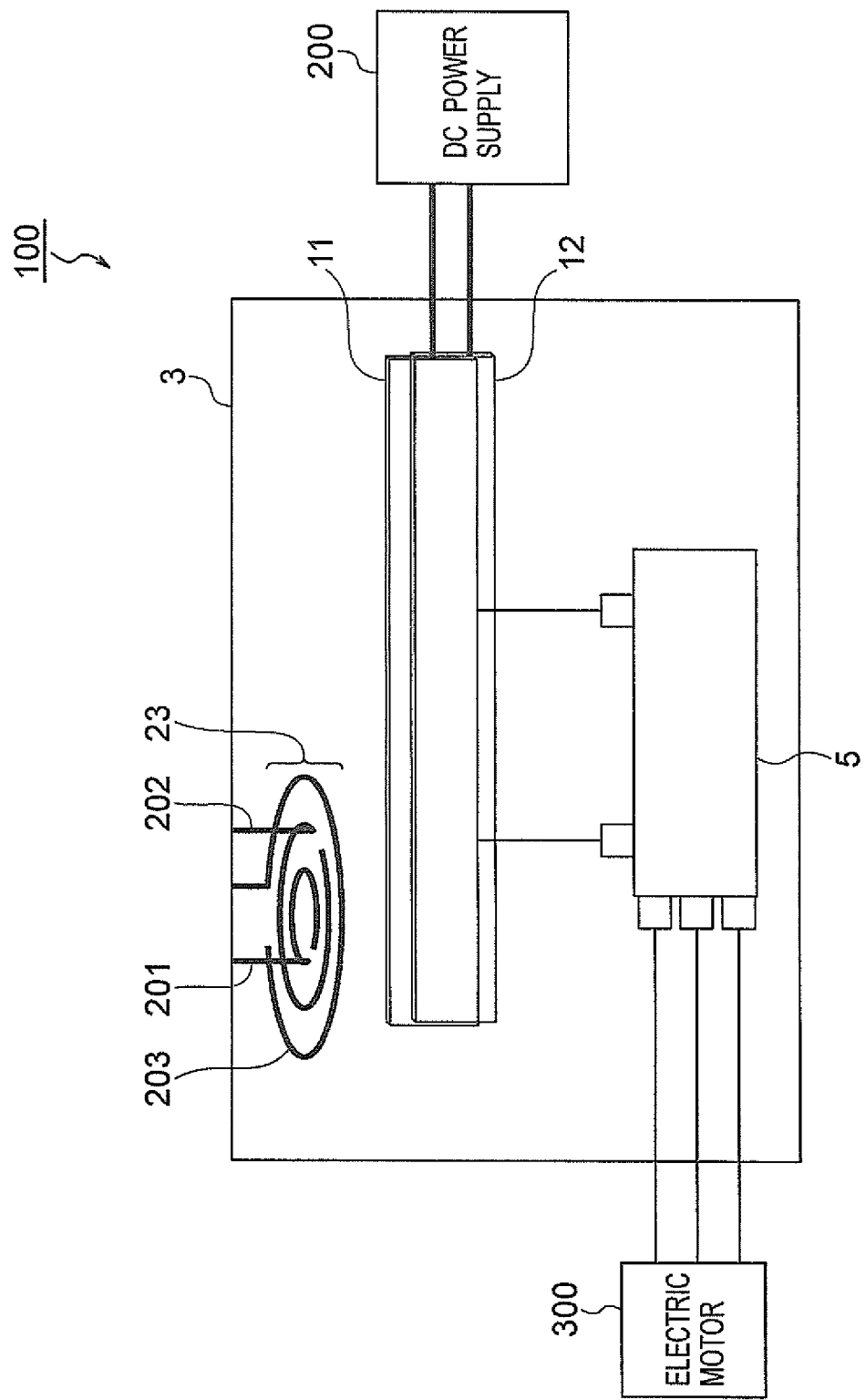
FIG. 27 is a schematic diagram illustrating a drive system for an electric vehicle including a power conversion device according to a modification of the embodiment of the present invention.
Figure 28:
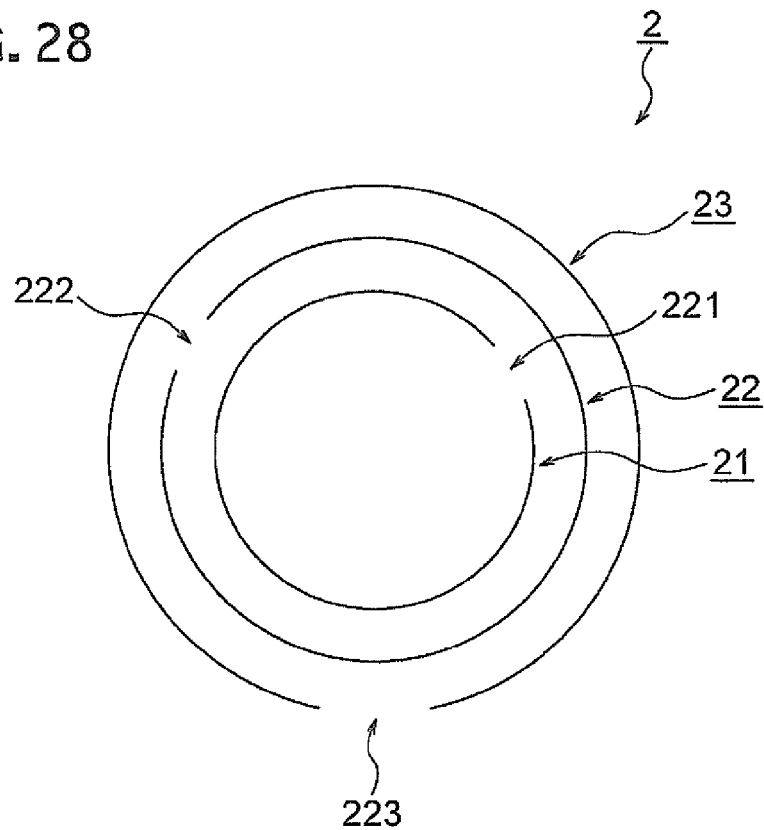
FIG. 28 is a plan view illustrating the conductive member of FIG. 27.

Incidentally, as illustrated in FIGS. 27 and 28, the conductive member 2 of the embodiment may be provided with a third conductive member 203 which is arranged outward of the second conductive member 202 and is longer than the second conductive member 202 and whose shape is similar to that of the second conductive member 202. FIG. 27 is a schematic diagram illustrating a drive system including the conductive member 2 according to a modification of the embodiment of the present invention. FIG. 28 is a plan view of the conductive member 2 of FIG. 27. The length of the third conductive member 203 is $5\lambda/4$, and includes a third conductive portion 23 formed in linear shape and formed in a loop shape partially having a gap 223. Also, the second conductive portion 22 is arranged outward of the gap 221, and the third conductive portion 23 is arranged outward of the gap 222. Thereby, noise which leaks through a portion having the gap 221 is covered by the second conductive portion 22, and noise which leaks through a portion having the gap 222 is covered by the third conductive portion 23, so that the leakage of the noise can be prevented.

Figure 29:
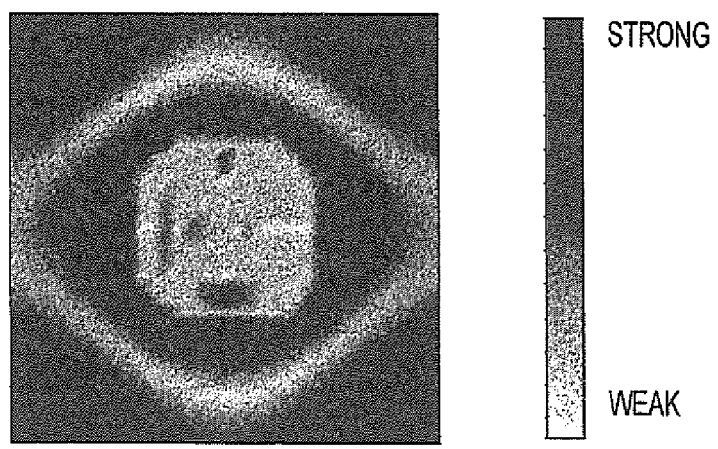
FIG. 29 is a graph representing a noise distribution on the one surface of the housing 3 of FIG. 27.

FIG. 29 illustrates a noise distribution on the one surface of the housing 3 in the modification illustrated in FIGS. 27 and 28. The conductive member 2 illustrated in FIGS. 27 and 28 is provided thereby to prevent the leakage of the noise.

Figure 30:
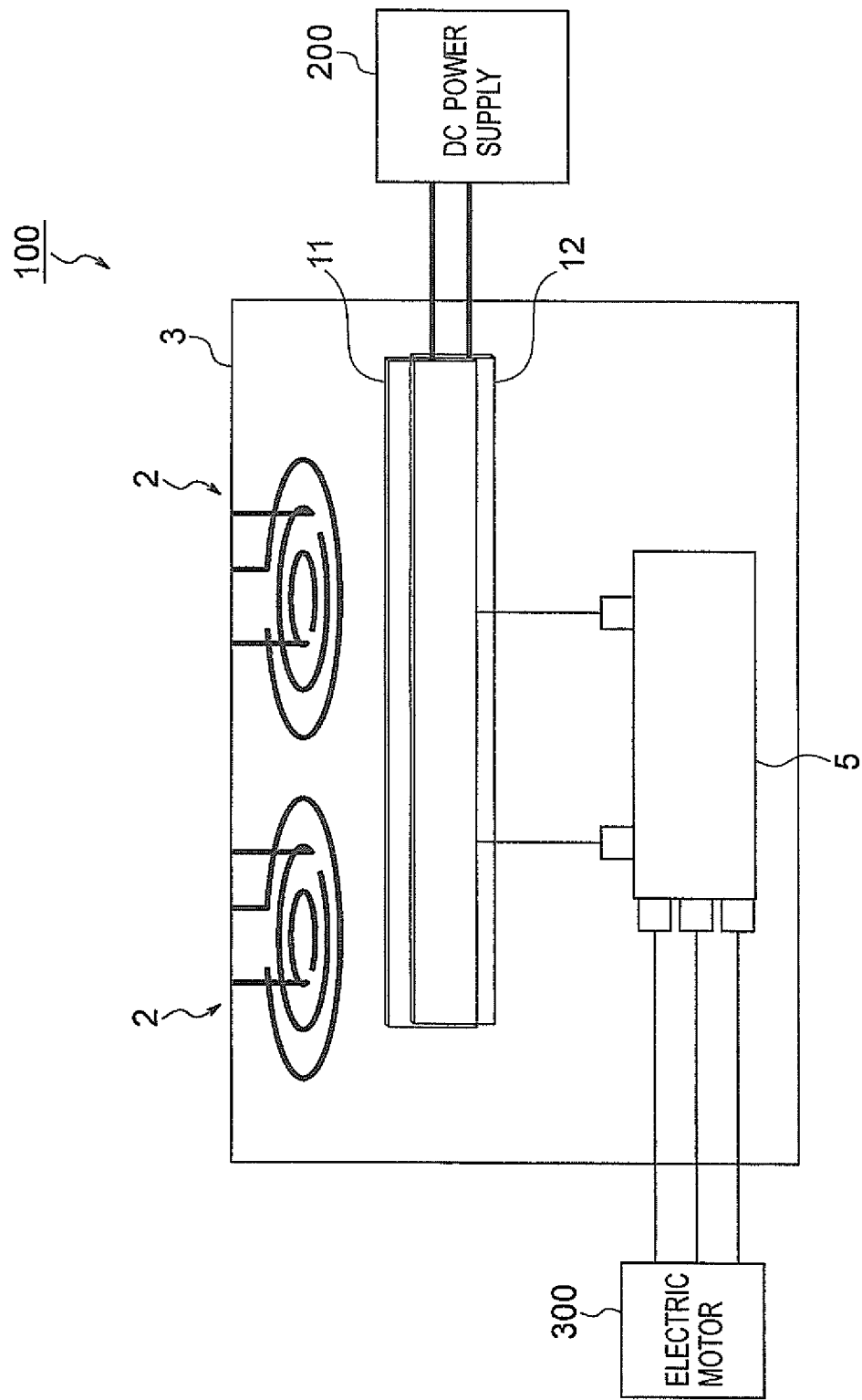
FIG. 30 is a schematic diagram illustrating a drive system for an electric vehicle including a power conversion device according to a modification of the embodiment of the present invention.

Incidentally, as illustrated in FIG. 30, the plural conductive members 2 illustrated in FIGS. 27 and 28 may be connected to the housing 3. FIG. 30 is a schematic diagram illustrating a drive system including the conductive member 2 according to a modification of the embodiment of the present invention. On the one surface of the housing 3, an area of a region where noise is reduced can be increased, and thus, the leakage of the noise from the housing 3 can be prevented.

Figure 31:
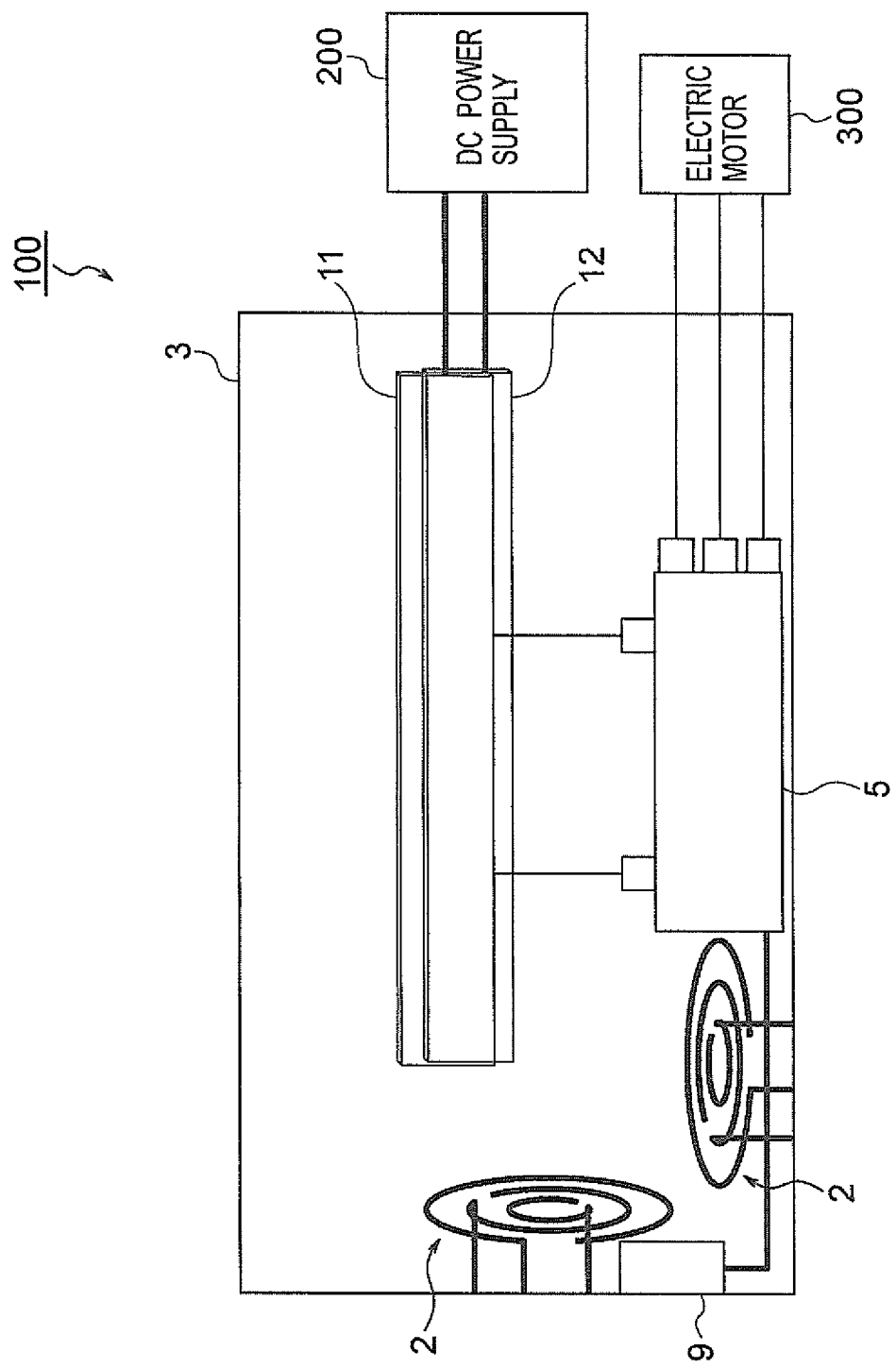
FIG. 31 is a schematic diagram illustrating a drive system for an electric vehicle including a power conversion device according to a modification of the embodiment of the present invention.

Incidentally, as illustrated in FIG. 31, a controller 9 may be provided between the conductive member 2 and the housing 3. FIG. 31 is a schematic diagram illustrating a drive system including the conductive member 2 and the controller 9 according to a modification of the embodiment of the present invention. The controller 9 generates a control signal for switching the switching elements included in the power module 5 between the ON state and the OFF state and transmits the control signal to the switching elements thereby to control the power module 5. A portion between the conductive member 2 and the housing 3 is a portion in which noise is reduced on the one surface of the housing 3. Thus, the controller 9 which is susceptible to noise is provided between the conductive member 2 and the housing 3 thereby to enable preventing the controller 9 from being affected by the influence of the noise.

Incidentally, in this modification, the first conductive member 201, the second conductive member 202 and the third conductive member 203 can each have a length of $n\lambda/4$, where n is an odd number equal to or more than 1. Also, the first conductive portion 21, the second conductive portion 22 and the third conductive portion 23 may have a polygonal shape. Also, in the modification, four or more conductive members 2 may be connected to the housing 3.

Incidentally, in the conductive member 2 illustrated in FIGS. 21, 24 and 27, the length of the conductive member 2 between the point of connection to the housing 3 and the bending point is negligibly short as compared to the length (or the noise wavelength λ) of other portions of the conductive member 2. Thus, substantially, the length between the portion of connection to the housing 3 and the open end is defined as nλ/4.

The above-described controller 9 corresponds to a "control device" according to the present invention.

While the contents of the present invention have been described above with reference to the embodiments, it is to be understood that the present invention is not limited to these descriptions, and it would be obvious to one of ordinary skill in the art that various modifications and improvements could be made thereto.

According to the present invention, noise propagating through the metal housing 3 is canceled out by the conductive member 2, and thus, the noise leaking from the metal housing 3 can be suppressed. Therefore, the present invention has industrial applicability.

The invention claimed is:

1. A power conversion device comprising:
    a power module which switches a switching element between ON and OFF states thereby to convert power inputted to the power module and to output the converted power;
    a housing made of metal, which houses the power module; and
    a conductive member connected to the housing,
    wherein the conductive member has a first open end and is connected to the housing at a position at which a length thereof from the first open end is nλ/4, where "n" is an odd number equal to or more than 1, and "λ" is a wavelength of noise produced by switching element between the ON and OFF states, and
    the conductive member diverges into a plurality of branches at a position at which a length thereof from the open end is mλ/4, where "m" is an odd number equal to or more than 1, and one of the plurality of branches is connected to the housing.

2. The power conversion device according to claim 1, further comprising a power feeder bus which connects the power module to a power supply, wherein the wavelength of the noise is set according to a frequency of radiation noise radiated from the power feeder bus by switching the switching element between the ON and OFF states.

3. The power conversion device according to claim 1, wherein another of the plurality of branches is connected to the housing.

4. The power conversion device according to claim 1, wherein the conductive member has a second open end formed in the other of the plurality of branches, and is connected to the housing at a position at which a length thereof from the second open end is nλ/4.

5. The power conversion device according to claim 1, wherein the conductive member is formed in a line and formed in a loop or polygonal shape partially having a gap.

6. The power conversion device according to claim 5, wherein the conductive member is formed in a plane parallel to one surface of the housing in such a way as to surround the one surface of the housing.

7. The power conversion device according to claim 1, wherein the conductive member includes:
    a first conductive member formed in a line and formed in a loop or polygonal shape partially having a gap; and
    a second conductive member formed in a line and formed in a loop or polygonal shape partially having a gap, the second conductive member being longer than the first conductive member, and
    a portion of the first conductive member formed in the loop or polygonal shape and a portion of the second conductive member formed in the loop or polygonal shape have the same point of center and are arranged in the same plane.

8. The power conversion device according to claim 7, wherein a portion of the second conductive member not having the gap is arranged outward of a portion of the first conductive member having the gap.

9. The power conversion device according to claim 1, wherein a plurality of the conductive members are connected to the housing.

10. The power conversion device according to claim 1, further comprising a control device which controls the power module, wherein the control device is provided between the conductive member and the housing.

11. A power conversion device comprising:
    switching means for switching switching element between ON and OFF states thereby to convert power inputted to the switching means and to output the converted power;
    housing means for housing the switching means; and
    reflecting means for reflecting noise produced by switching the switching element between the ON and OFF states and then propagating through the switching means and the housing means to the reflecting means,
    wherein the reflecting means has a first open end and is connected to the housing means at a position at which a length thereof from the first open end is nλ/4, where "n" is an odd number equal to or more than 1, and "λ" is a wavelength of the noise, and
    the conductive member diverges into a plurality of branches at a position at which a length thereof from the open end is mλ/4, where "m" is odd number equal to or more than 1, and one of the plurality of branches is connected to the housing.

* * * * *